US012695046B2

(12) United States Patent
Miyamoto

(10) Patent No.: US 12,695,046 B2
(45) Date of Patent: Jul. 28, 2026

(54) METHOD FOR ESTIMATING CATHODE LIFETIME OF ELECTRON GUN, AND ELECTRON BEAM WRITING APPARATUS

(71) Applicant: NuFlare Technology, Inc., Yokohama (JP)

(72) Inventor: Nobuo Miyamoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 609 days.

(21) Appl. No.: 17/942,295

(22) Filed: Sep. 12, 2022

(65) Prior Publication Data

US 2023/0154720 A1 May 18, 2023

(30) Foreign Application Priority Data

Nov. 16, 2021 (JP) ................................. 2021-186687
Aug. 18, 2022 (JP) ................................. 2022-130652

(51) Int. Cl.
*H01J 37/073* (2006.01)
*G03F 7/20* (2006.01)
(Continued)

(52) U.S. Cl.
CPC .......... *H01J 37/073* (2013.01); *H01J 37/243* (2013.01); *H01J 37/3177* (2013.01); *H01J 2237/0435* (2013.01)

(58) Field of Classification Search
CPC .... H01J 37/073; H01J 37/243; H01J 37/3177; H01J 2237/0435; H01J 2237/06308;
(Continued)

(56) References Cited

U.S. PATENT DOCUMENTS 3,887,835 A * 6/1975 Nomura .................. H01J 3/021
850/9
2015/0187541 A1* 7/2015 Dinu-Gurtler ............ H01J 1/28
250/492.3
(Continued)

FOREIGN PATENT DOCUMENTS

CN          112395805 A * 2/2021 ............. G06F 30/27
JP    2009-283217 A   12/2009
(Continued)

OTHER PUBLICATIONS

Espacenet English Translation of CN 112395805 (Year: 2021).*
(Continued)

*Primary Examiner* — David E Smith
*Assistant Examiner* — Laura Eloise Tandy
(74) *Attorney, Agent, or Firm* — Oblon, McClelland, Maier & Neustadt, L.L.P.

(57) ABSTRACT

A method for estimating the cathode lifetime of an electron gun includes recording the change amount, per unit temperature increase of the cathode of an electron gun which emits an electron beam, with respect to a parameter value relating to the electron beam, to be recorded in relation to the usage time of the cathode, and estimating the lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting the estimated lifetime.

10 Claims, 15 Drawing Sheets

(DURING WRITING)

S102 Emi/I<Eth ?
NO / YES
S104 CHANGE CATHODE TEMPERATURE
S106 CALCULATE PARAMETER
S108 RECORD
S110 ESTIMATE LIFETIME
S112 REMAINING LIFETIME < tth ?
NO / YES
S114 OUTPUT ALARM

(51) Int. Cl.

| | | |
|---|---|---|
| *G06F 30/20* | (2020.01) |
| *H01J 37/06* | (2006.01) |
| *H01J 37/24* | (2006.01) |
| *H01J 37/317* | (2006.01) |

(58) Field of Classification Search
CPC .. H01J 2237/065; H01J 37/06; H01J 37/3174; G06F 30/20; G06F 2119/04; G03F 7/2061
See application file for complete search history.

(56) References Cited

U.S. PATENT DOCUMENTS

| | | | | |
|---|---|---|---|---|
| 2017/0032926 A1* | 2/2017 | Miyamoto | .......... | H01J 37/3174 |
| 2017/0310074 A1* | 10/2017 | Kagiwada | ............. | H01S 5/0021 |
| 2019/0080879 A1* | 3/2019 | Miyamoto | ............. | H01J 37/07 |
| 2019/0237289 A1* | 8/2019 | Kasuya | ................... | H01J 9/025 |
| 2022/0157553 A1 | 5/2022 | Miyamoto et al. | | |

FOREIGN PATENT DOCUMENTS

| | | | | |
|---|---|---|---|---|
| JP | 2010-062374 | A | | 3/2010 |
| JP | 2021-068751 | A | | 4/2021 |
| JP | 2021-86658 | A | | 6/2021 |
| JP | 2021086658 | A | * | 6/2021 |
| JP | 2022-081185 | A | | 5/2022 |
| KR | 10-1998-0023536 | A | | 10/1999 |
| KR | 10-2014-0106429 | A | | 9/2014 |

OTHER PUBLICATIONS

English Translation of CN112395805A Ye, et. al. (Year: 2021).*
English Translation of JP2021086658A (Year: 2021).*
YE translation (Year: 2021).*
Iwata translation (Year: 2021).*
Combined Taiwanese Office Action and Search Report issued Dec. 6, 2023 in Taiwanese Patent Application No. 111138648 (with unedited computer-generated English Translation), 9 pages.
Korean Office Action dated March 9. 2028. Issued in Korean Patent Application No. 10-2022-0144584 (with English translation.

* cited by examiner (DURING WRITING)

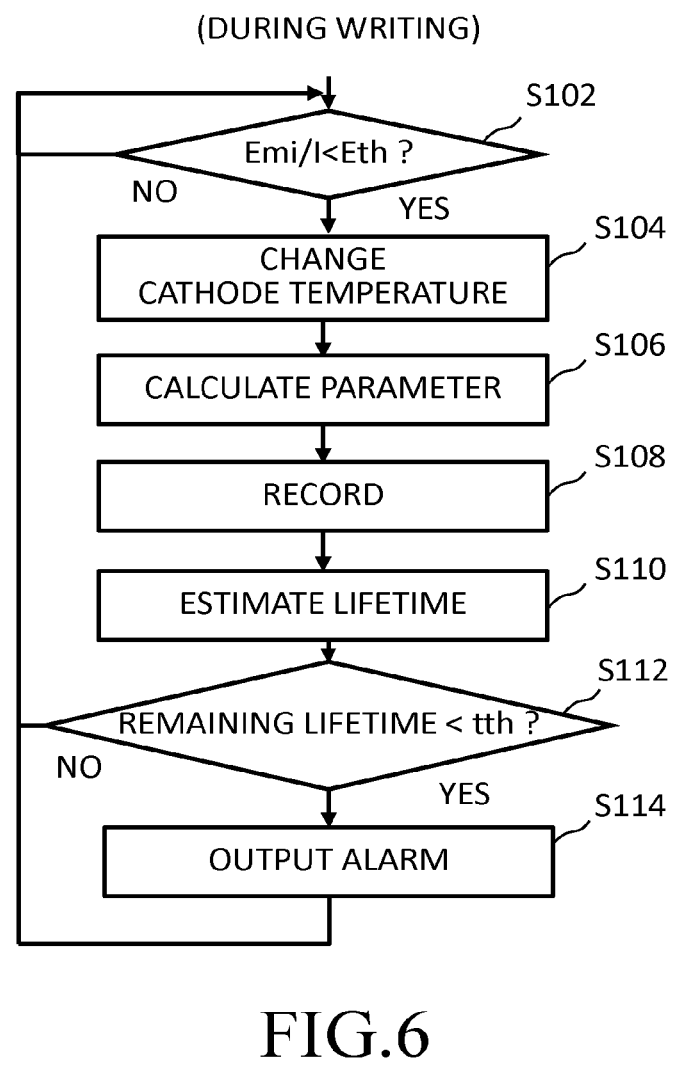

```
        ┌──────────────────────────────────┐
        │                                  │
        │         ╱◇╲                 S102  │
        └──────◇       ◇──────              │
          NO   ╲ Emi/I<Eth ? ╱              │
               ╲◇       ◇╱                  │
                 ╲     ╱                     │
                  ╲   ╱ YES                  │
                    ▼                  S104  │
        ┌──────────────────────────┐        │
        │         CHANGE           │        │
        │  CATHODE TEMPERATURE     │        │
        └──────────────────────────┘        │
                    │              S106      │
                    ▼                        │
        ┌──────────────────────────┐        │
        │   CALCULATE PARAMETER    │        │
        └──────────────────────────┘        │
                    │              S108      │
                    ▼                        │
        ┌──────────────────────────┐        │
        │         RECORD           │        │
        └──────────────────────────┘        │
                    │              S110      │
                    ▼                        │
        ┌──────────────────────────┐        │
        │     ESTIMATE LIFETIME    │        │
        └──────────────────────────┘        │
                    │              S112      │
                    ▼                        │
             ╱◇         ◇╲                   │
        ◇                    ◇───────────────┘
          REMAINING LIFETIME < tth ?
        ╲◇                    ◇╱
          NO  ╲           ╱
               ╲         ╱ YES
                 ▼            S114
        ┌──────────────────────────┐
        │      OUTPUT ALARM        │
        └──────────────────────────┘
```

Emi/I<Eth ?     S102

CHANGE
CATHODE TEMPERATURE     S104

CALCULATE PARAMETER     S106

RECORD     S108

ESTIMATE LIFETIME     S110

REMAINING LIFETIME < tth ?     S112

OUTPUT ALARM     S114

FIG.6

Emislope

ΔEmislope

OPERATING TIME (USAGE TIME)

OPERATING TIME  (USAGE TIME)

OPERATING TIME  (USAGE TIME)

FIG.7D    Emi

ENLARGED VIEW    OPERATING TIME  (USAGE TIME)

FIG.7E    Emi

Bias    DECREASING AS A WHOLE

CURRENT DENSITY
SAMPLE SURFACE
CURRENT

ALLOWABLE RANGE

DEVICE
SPECIFICATION
VALUE

EXPOSURE REGION TO BE IRRADIATED WITH BEAMS IN THIRD ROW

1

METHOD FOR ESTIMATING CATHODE LIFETIME OF ELECTRON GUN, AND ELECTRON BEAM WRITING APPARATUS

CROSS-REFERENCE TO RELATED APPLICATION

This application is based upon and claims the benefit of priority from prior Japanese Patent Application No. 2021-186687 filed on Nov. 16, 2021 in Japan, and prior Japanese Patent Application No. 2022-130652 filed on Aug. 18, 2022 in Japan, the entire contents of which are incorporated herein by reference.

BACKGROUND OF THE INVENTION

Field of the Invention

One aspect of an embodiment of the present invention relates to a method for estimating/predicting the lifetime of the cathode of an electron gun, and to an electron beam writing apparatus.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system performs to form multiple beams by letting portions of an electron beam emitted from an electron gun individually pass through a corresponding one of a plurality of holes in a mask, to provide a blanking control for respective formed beams, to reduce, by an optical system, beams that were not blocked in the blanking process to reduce a mask image, and to deflect, by a deflector, the reduced beams to irradiate a desired position on a sample or "target object".

In an electron gun which emits electron beams, the operating temperature of the cathode increases along with achieving higher brightness of the cathode. As a result, the consumption rate of the cathode crystal is increased. If a certain quantity of the crystal evaporates, since desired performance cannot be achieved, the lifetime of the cathode ends and the cathode needs to be exchanged. Therefore, it is desired and required to estimate/predict the lifetime of the cathode. If the lifetime cannot be estimated, since the timing of the cathode exchange is not measurable, it becomes difficult to operate the apparatus systematically. Further, if the lifetime cannot be estimated, a cathode exchange must be performed earlier, and thus, the lifetime of the cathode becomes short, thereby increasing the down time of the apparatus due to the cathode exchange. Furthermore, if the cathode lifetime is exhausted during writing, the processing during writing results in vain.

There is conventionally disclosed a technique in which relation between an emission current and a current density at a bias saturation point, and relation between an emission current and a filament power at a bias saturation point are measured, and, referring to these relations, a filament power which provides an emission current in a set current density is calculated (e.g., refer to Japanese Patent Application Laid-open (JP-A) No. 2010-062374).

BRIEF SUMMARY OF THE INVENTION

According to one aspect of the present invention, a method for estimating a cathode lifetime of an electron gun includes recording a change amount, per unit temperature increase of a cathode of an electron gun which emits an electron beam, with respect to a parameter value relating to the electron beam, to be recorded in relation to a usage time of the cathode, and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting an estimated lifetime.

According to another aspect of the present invention, a method for estimating a cathode lifetime of an electron gun includes recording a change amount, per unit temperature increase of a cathode of an electron gun which emits an electron beam, with respect to a value obtained by differentiating a sample surface current at a position on a sample surface irradiated with the electron beam, by an emission current of the electron beam, to be recorded in relation to a usage time of the cathode, and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting an estimated lifetime.

According to yet another aspect of the present invention, a method for estimating a cathode lifetime of an electron gun includes recording a change amount, per unit temperature increase of a cathode of an electron gun which emits an electron beam, with respect to a bias voltage to be applied to a Wehnelt electrode of the electron gun, to be recorded in relation to a usage time of the cathode, and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting an estimated lifetime.

According to yet another aspect of the present invention, a method for estimating a cathode lifetime of an electron gun includes recording a change amount, per unit temperature increase of a cathode of an electron gun which emits an electron beam, with respect to a sample surface current of the electron beam at a position on a sample surface irradiated with the electron beam, to be recorded in relation to a usage time of the cathode, and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting an estimated lifetime.

According to yet another aspect of the present invention, a method for estimating a cathode lifetime of an electron gun includes recording a change amount, per unit temperature increase of a cathode of an electron gun which emits an electron beam, with respect to a current density of the electron beam at a position on a sample surface irradiated with the electron beam, to be recorded in relation to a usage time of the cathode, and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by approximating the change amount recorded a plurality of times, a time at which the change amount becomes zero as the lifetime of the cathode, and outputting an estimated lifetime.

According to yet another aspect of the present invention, a method for estimating a cathode lifetime of an electron gun includes recording a temperature of a cathode of an electron gun which emits an electron beam, to be recorded in relation to a usage time of the cathode, and estimating, using an approximate line obtained by approximating a change of the temperature of the cathode having been recorded, a time at which the temperature of the cathode reaches a threshold value, as a lifetime of the cathode, and outputting an estimated lifetime.

According to yet another aspect of the present invention, a method for estimating a cathode lifetime of an electron gun includes recording a change amount, per unit time, with respect to an emission current of an electron beam emitted from an electron gun, to be recorded in relation to a usage time of a cathode of the electron gun, and estimating, using an approximate line obtained by approximating the change amount having been recorded a plurality of times, a time obtained by adding a margin to a time at which the change amount becomes zero, as a lifetime of the cathode, and outputting an estimated lifetime.

According to yet another aspect of the present invention, an electron beam writing apparatus includes a recording circuit configured to perform recording as described above, an estimation circuit configured to estimate a lifetime as described above, an output circuit configured to output, at a time of an end of the lifetime estimated is approaching, information indicating that the lifetime is coming to the end soon, and a writing mechanism configured to include an electron gun which emits an electron beam and to write a pattern on a sample by using the electron beam.

BRIEF DESCRIPTION OF THE DRAWINGS

FIG. 6 is a flowchart showing main steps of an example of a control method of a writing apparatus according to the first embodiment;

FIGS. 7A to 7F are graphs illustrating a change of each parameter in accordance with use of a cathode according to the first embodiment;

DETAILED DESCRIPTION OF THE INVENTION

An aspect of an embodiment of the present invention provides a method and apparatus that can estimate/predict with high accuracy the lifetime of the cathode of an electron gun.

Embodiments below describe a configuration using multiple beams as an electron beam. However, it is not limited thereto. A configuration using a single beam is also preferable. Further, although a writing apparatus is described below, any other apparatus is also preferable as long as it uses electron beams emitted from a thermal electron emission source. For example, it may be an image acquisition apparatus, an inspection apparatus, or the like.

First Embodiment

Figure 1:
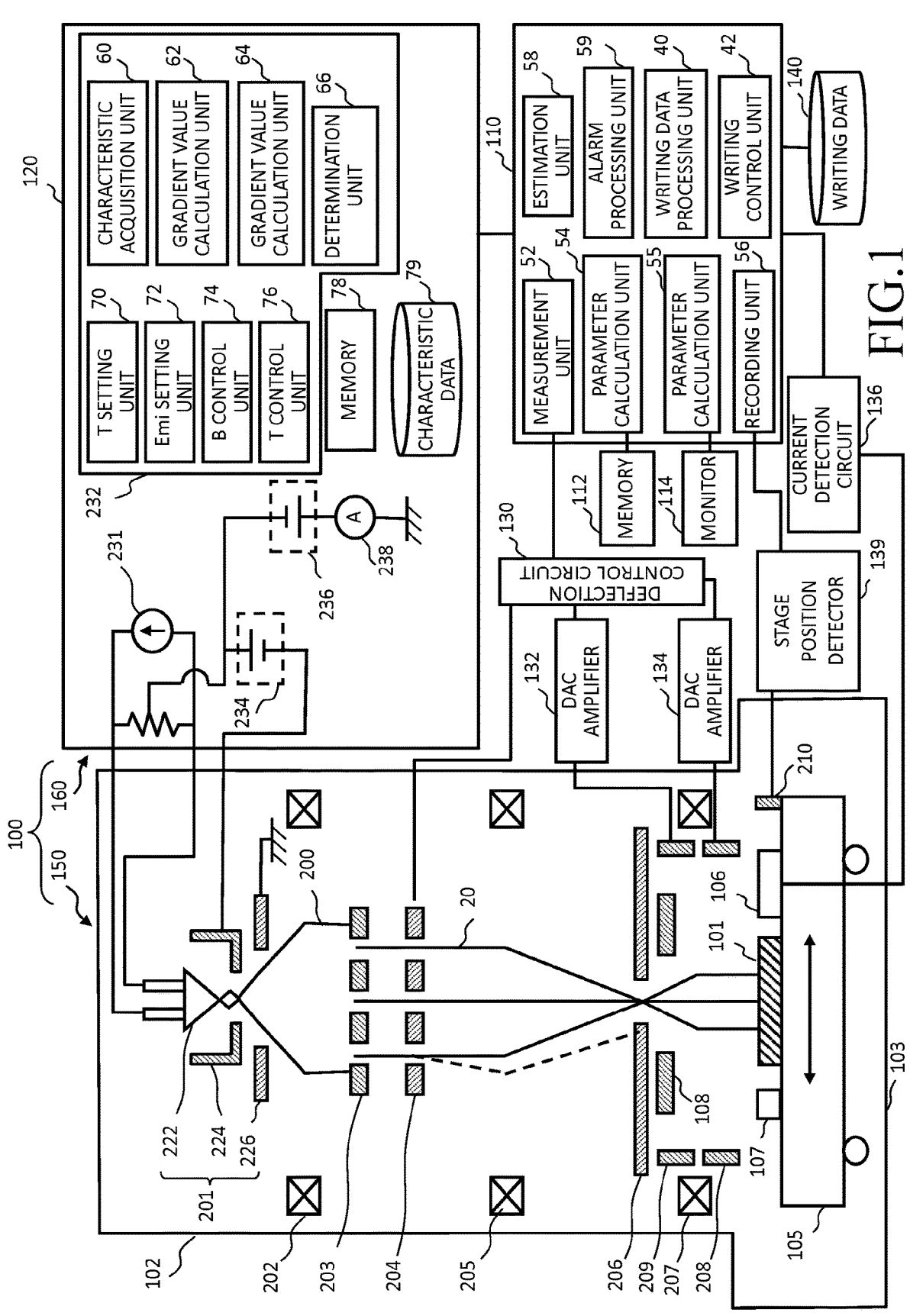
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple electron beam writing apparatus. The writing mechanism 150 includes an electron beam column 102 (multiple electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a detector 108, a deflector 208, and a deflector 209. In the writing chamber 103, an XY stage 105 is disposed. On the XY stage 105, there is placed a target object or "sample" 101 such as a mask blank on which resist has been applied serving as a writing target substrate when writing is performed. The sample 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105, and a Faraday cup 106 are placed. Furthermore, on the XY stage 105, a mark 107 is arranged (formed).

The electron gun 201 (electron beam emission source) includes a cathode 222, a Wehnelt 224 (Wehnelt electrode), and an anode 226 (anode electrode). The anode 226 is grounded.

The control system circuit 160 includes a control computer 110, a memory 112, a monitor 114, an electron gun power-supply device 120, a deflection control circuit 130, DAC (digital-analog converter) amplifier units 132 and 134, a current detection circuit 136, a stage position detector 139, and a storage device 140 such as a magnetic disk drive. The control computer 110, the memory 112, the monitor 114, the electron gun power-supply device 120, the deflection control circuit 130, the DAC amplifier units 132 and 134, the current detection circuit 136, the stage position detector 139, and the storage device 140 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and each electrode is connected to a DAC amplifier 134 and controlled by the deflection control circuit 130 through the corresponding DAC amplifier 134. The deflector 209 is composed of at least four electrodes (or "poles"), and each electrode is connected to a DAC amplifier unit 132 and controlled by the deflection control circuit 130 through the corresponding DAC amplifier unit 132. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light. Outputs of the Faraday cup 106 are connected to the current detection circuit 136.

In the control computer 110, there are arranged a measurement unit 52, a parameter calculation unit 54, a parameter calculation unit 55, a recording unit 56, an estimation unit 58, an alarm processing unit 59, a writing data processing unit 40, and a writing control unit 42. Each of the " . . . units" such as the measurement unit 52, the parameter calculation unit 54, the parameter calculation unit 55, the recording unit 56, the estimation unit 58, the alarm processing unit 59, the writing data processing unit 40, and the writing control unit 42 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the measurement unit 52, the parameter calculation unit 54, the parameter calculation unit 55, the recording unit 56, the estimation unit 58, the alarm processing unit 59, the writing data processing unit 40, and the writing control unit 42, and information being operated are stored in the memory 112 each time.

In the electron gun power-supply device 120, there are arranged a control computer 232, a memory 78, a storage device 79 such as a magnetic disk drive, an acceleration voltage power circuit 236, a bias voltage power circuit 234, a filament power supply circuit 231 (filament power supply unit), and an ammeter 238. To the control computer 232, there are connected the memory 78, the storage device 79, the acceleration voltage power circuit 236, the bias voltage power circuit 234, the filament power supply circuit 231, and the ammeter 238 through a bus (not shown).

In the control computer 232, there are arranged a characteristic acquisition unit 60, a gradient value calculation unit 62, a gradient value calculation unit 64, a determination unit 66, a cathode temperature T setting unit 70, an emission current Emi setting unit 72, a bias voltage B control unit 74, and a cathode temperature T control unit 76. Each of the " . . . units" such as the characteristic acquisition unit 60, the gradient value calculation unit 62, the gradient value calculation unit 64, the determination unit 66, the cathode temperature T setting unit 70, the emission current Emi setting unit 72, the bias voltage B control unit 74, and the cathode temperature T control unit 76 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the characteristic acquisition unit 60, the gradient value calculation unit 62, the gradient value calculation unit 64, the determination unit 66, the cathode temperature T setting unit 70, the emission current Emi setting unit 72, the bias voltage B control unit 74, and the cathode temperature T control unit 76, and information being operated are stored in the memory 78 each time.

The negative electrode (−) side of the acceleration voltage power circuit 236 is connected to both poles of the cathode 222 in the electron beam column 102. The positive electrode (+) side of the acceleration voltage power circuit 236 is grounded through the ammeter 238 connected in series. Further, the negative electrode (−) of the acceleration voltage power circuit 236 branches to be also connected to the positive electrode (+) of the bias voltage power circuit 234. The negative electrode (−) of the bias voltage power circuit 234 is electrically connected to the Wehnelt 224 disposed between the cathode 222 and the anode 226. In other words, the bias voltage power circuit 234 is arranged to be electrically connected between the negative electrode (−) of the acceleration voltage power circuit 236 and the Wehnelt 224. Then, the filament power supply circuit 231 controlled by the T control unit 76 supplies a current between both electrodes of the cathode 222 in order to heat the cathode 222 to a predetermined temperature. In other words, the filament power supply circuit 231 supplies a filament power W to the cathode 222. The filament power W and the cathode temperature T can be defined by a certain relation, and the cathode can be heated to a desired temperature by the filament power W. Thus, the cathode temperature T is controlled by the filament power W. The filament power W is defined by the product of a current flowing between both electrodes of the cathode 222 and a voltage applied to between both electrodes of the cathode 222 by the filament power supply circuit 231. The acceleration voltage power circuit 236 applies an acceleration voltage between the cathode 222 and the anode 226. The bias voltage power circuit 234 controlled by the B control unit 74 applies a negative bias voltage to the Wehnelt 224.

Writing data is input from the outside of the writing apparatus 100, and stored in the storage device 140. The writing data generally defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
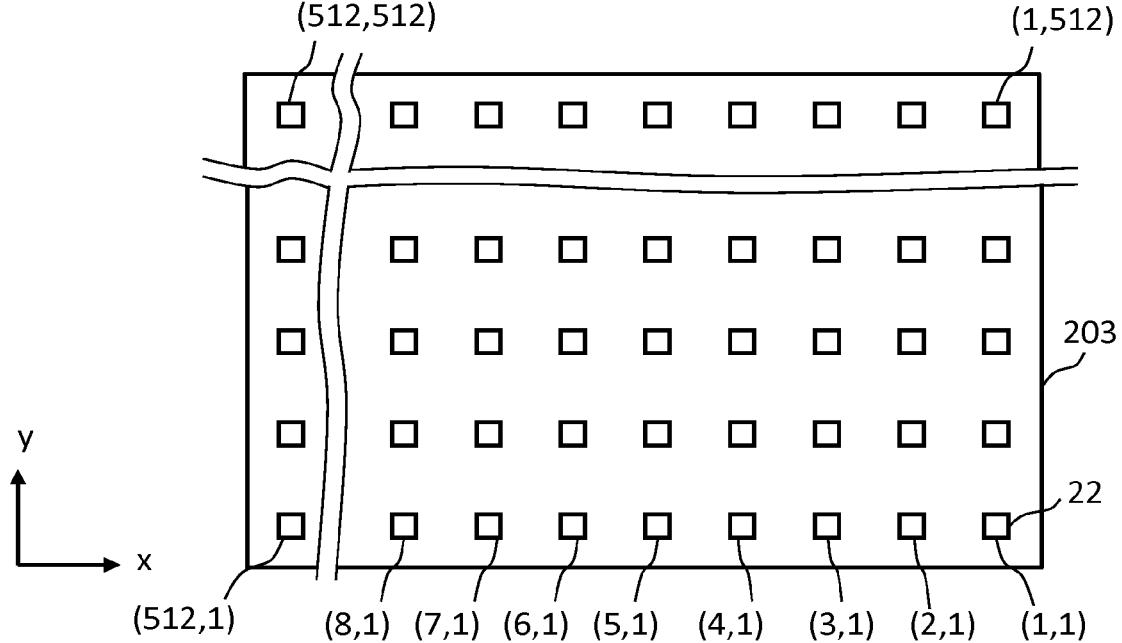
FIG. 2 is a conceptual diagram showing a configuration of a shaping aperture array substrate according to the first embodiment.

FIG. 2 is a conceptual diagram showing a configuration of the shaping aperture array substrate 203 according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms the multiple beams 20. Specifically, the multiple beams 20 are formed by letting portions of the electron beam 200 individually pass through a corresponding one of a plurality of holes 22. The method of arranging the holes 22 is not limited to the case of FIG. 2 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and (k+2)th rows which are arrayed in the length direction (in the y direction), each hole in the (k+1)th row and each hole in the (k+2)th row may be arranged mutually displaced in the width direction (in the x direction) by a dimension "b".

Figure 3:
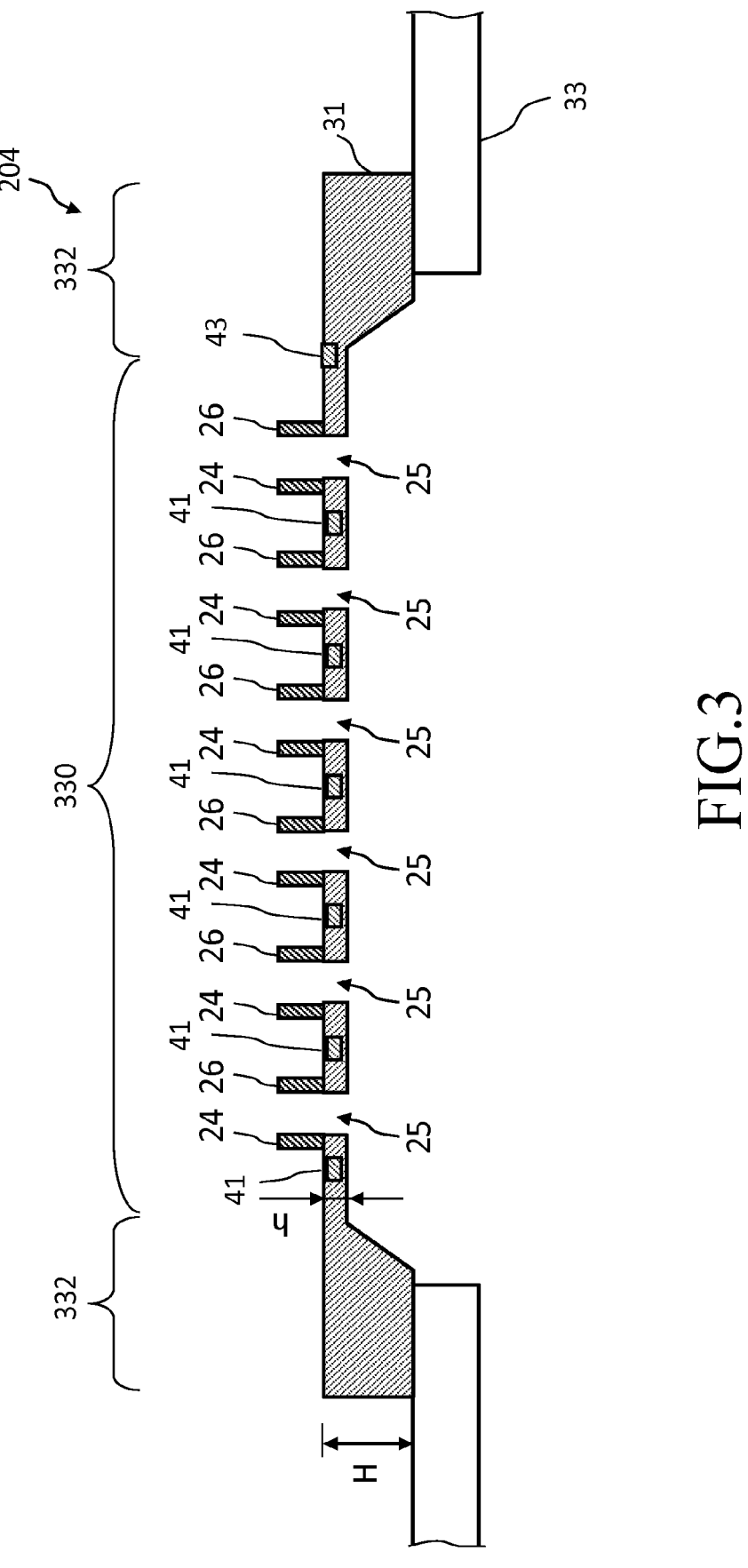
FIG. 3 is a sectional view showing a configuration of a blanking aperture array mechanism according to the first embodiment.

FIG. 3 is a sectional view showing a configuration of a blanking aperture array mechanism 204 according to the first embodiment. With regard to the structure of the blanking aperture array mechanism 204, a semiconductor substrate 31 made of silicon, etc. is placed on a support table 33 as shown in FIG. 3. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 2. In other words, in the membrane region 330 of the substrate 31, there are formed a plurality of passage holes 25, in an array state, through each of which a corresponding one of the multiple beams 20 passes. Further, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 3, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Further, close to each passage hole 25 in the membrane region 330, inside the substrate 31, there is arranged a control circuit 41 (logic circuit) which applies a deflection voltage to the control electrode 24 for the passage hole 25 concerned. The counter electrode 26 for each beam is grounded.

In the control circuit 41, there is arranged an amplifier (an example of a switching circuit) (not shown) such as a CMOS inverter circuit. The output line (OUT) of the amplifier is connected to the control electrode 24. On the other hand, the counter electrode 26 is applied with a ground electric potential. As an input (IN) of the amplifier, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. On the other hand, in a state (active state) where an H potential is applied to the input (IN) of the amplifier, the output (OUT) of the amplifier becomes a ground potential, and therefore, since there is no potential difference from the ground potential of the counter electrode 26, a corresponding beam is not deflected, and controlled to be in a beam ON condition by passing through the limiting aperture substrate 206.

A pair of the control electrode 24 and the counter electrode 26 individually provides blanking deflection of a corresponding beam of the multiple beams 20 by an electric potential switchable by the amplifier which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 of the writing apparatus 100 will be described. The electron beam 200 emitted from the electron gun 201 (electron emission source) illuminates the whole of the shaping aperture array substrate 203 by the illumination lens 202. A plurality of quadrangular holes 22 (openings) are formed in the shaping aperture array substrate 203. The region including all of the plurality of holes 22 is irradiated with the electron beam 200. For example, a plurality of quadrangular electron beams (multiple beams 20) are formed by letting portions of the electron beam 200 applied to the positions of the plurality of holes 22 individually pass through a corresponding hole of the plurality of holes 22 of the shaping aperture array substrate 203. The multiple beams 20 individually pass through corresponding blankers (first deflector: individual blanking mechanism) of the blanking aperture array mechanism 204. Each blanker deflects (provides blanking deflection) an electron beam passing therethrough individually.

The multiple beams 20 having passed through the blanking aperture array mechanism 204 are reduced by the reducing lens 205, and go toward the hole in the center of the limiting aperture substrate 206. Then, the electron beam in the multiple beams 20 which was deflected by the blanker of the blanking aperture array mechanism 204 deviates (shifts) from the hole in the center of the limiting substrate 206 and is blocked by the limiting aperture substrate 206. On the other hand, the electron beam which was not deflected by the blanker of the blanking aperture array mechanism 204 passes through the hole in the center of the limiting aperture substrate 206 as shown in FIG. 1. Blanking control is provided by ON/OFF of the individual blanking mechanism so as to control ON/OFF of beams. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed (all of the multiple beams 20 having passed) through the limiting aperture substrate 206 are collectively deflected in the same direction by the deflectors 208 and 209 in order to irradiate respective beam irradiation positions on the sample 101. Ideally, the multiple beams 20 irradiating at a time are aligned at pitches obtained by multiplying the arrangement pitch of a plurality of holes 22 of the shaping aperture array substrate 203 by a desired reduction ratio described above.

As described above, the operating temperature of the cathode 222 of the electron gun 201 which emits the electron beam 200 increases along with achieving higher brightness of the cathode 222. As a result, the consumption rate of the cathode crystal is increased. Therefore, while maintaining a required brightness, it is desirable to maintain the consumption rate (evaporation rate) of the cathode 222 as low as possible. In order to achieve this, it is desirable to maintain the cathode temperature T as low as possible within the range to acquire a required brightness.

Figure 4:
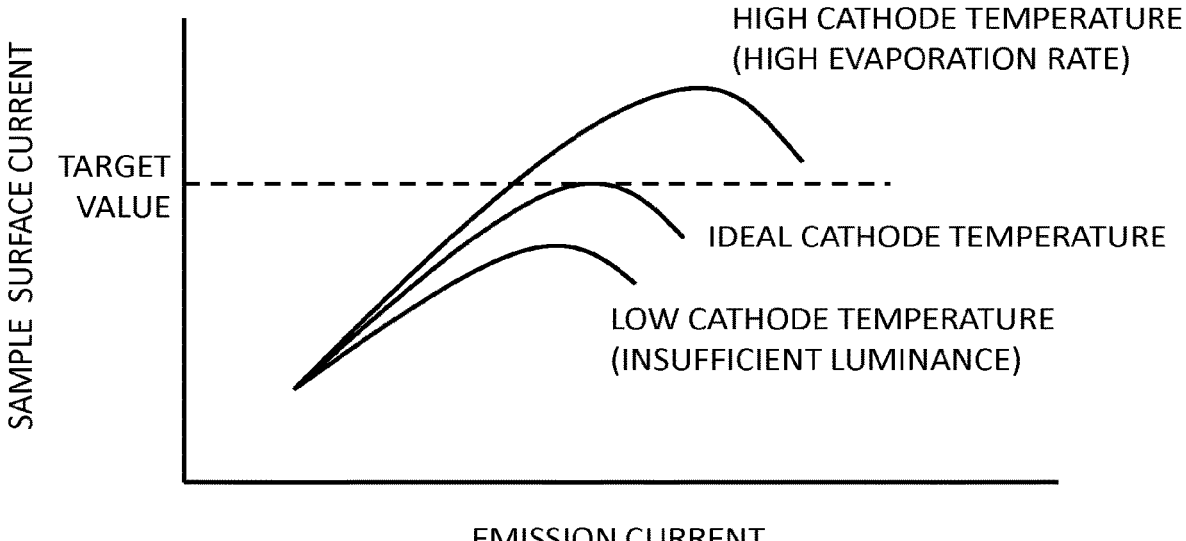
FIG. 4 is a graph showing an example of a characteristic between a sample surface current and an emission current according to the first embodiment.

FIG. 4 is a graph showing an example of a characteristic between a sample surface current and an emission current according to the first embodiment. As shown in FIG. 4, a peak exists in the characteristic between the sample surface current and the emission current. The peak position moves to the larger emission current side along with an increase of the cathode temperature. The sample surface current is a total current value of all the electron beams at the height position of the surface of the sample 101. The electron gun 201 controls the emission current such that the sample surface current gives a preset brightness. In other words, the electron gun 201 controls the emission current such that the sample surface current becomes the target value for obtaining a preset brightness. The cathode temperature that provides a characteristic that the sample surface current at the peak position is the target value of the sample surface current is the lowest cathode temperature to acquire a required brightness. If the cathode temperature is reduced to be lower than this, the characteristic shows that it is impossible to provide a brightness required on the surface of the sample. Conversely, if the cathode temperature is increased to be higher than this, the characteristic shows that the evaporation rate of the cathode becomes higher along with the increased cathode temperature. Therefore, the cathode temperature that provides a characteristic that the sample surface current at the peak position is the target value of the sample surface current is an ideal cathode temperature. In a conventional method for adjusting the operation conditions of the electron gun in the space charge region, the electron gun is controlled such that the target value of the sample surface current is obtained in an emission current which is sufficiently smaller than the emission current at the peak position. Therefore, the cathode has been used in a state of higher cathode temperature than required. The operation under a cathode temperature higher than needed will shorten the lifetime of the cathode. Then, according to the first embodiment, the cathode temperature is controlled to approach an ideal one, in the temperature-limited region where the emission current changes depending on a change of the cathode temperature.

First, an initial value of the emission current Emi, and an initial value of the cathode temperature T are set. Specifically, the T setting unit 70 sets an initial value of the cathode temperature T. The Emi setting unit 72 sets an initial value of the emission current Emi.

Under initial value conditions, the electron beam 200 is emitted from the electron gun 201. Specifically, first, the acceleration voltage power circuit 236 applies a preset acceleration voltage between the cathode 222 and the anode 226. The filament power supply circuit 231 controlled by the T control unit 76 supplies, to the cathode 222, a filament power W corresponding to the initial value of the cathode temperature T. The cathode temperature T is determined by the filament power W. Therefore, in the control system, the cathode temperature T is controlled by the filament power W. In such a state, the bias voltage power circuit 234 controlled by the B control unit 74 adjusts a negative bias voltage to be applied to the Wehnelt 224 such that the current value detected by the ammeter 238 becomes the initial value of the emission current Emi. Thereby, the electron beam 200 under initial value conditions is emitted from the electron gun 201.

Next, it is measured whether the electron beam 200 emitted from the electron gun 201 at a set cathode temperature has reached a pre-set target value of the sample surface current.

The XY stage 105 is moved to the position where the multiple beams 20 can be incident on the Faraday cup 106. Then, the Faraday cup 106 detects a current value of the multiple beams 20 formed from the electron beam 200 emitted from the electron gun 201, and having reached the surface of the sample. The Faraday cup 106 may detect the current value of the entire multiple beams 20 entering the cup simultaneously, or may detect the current value of each beam array group obtained by dividing the multiple beams 20 into a plurality of beam array groups. The detected current value is output to the current detection circuit 136, and, after analog signals are converted into digital signals, is output to the measurement unit 52. When the measured current value of all the multiple beams 20 has not reached the target value of the sample surface current, the negative bias voltage to be applied to the Wehnelt 224 is adjusted. If, even by this, still not reaching the target value of the sample surface current, since the cathode temperature is insufficient, the adjusting is similarly repeated while increasing the cathode temperature step by step until the target value is obtained. The change width (range) of the cathode temperature T per step may be optional. For example, it is preferable to set the range between 5° C. to 50° C. For example, it is set to 10° C.

The characteristic acquisition unit 60 acquires, while changing the emission current of an electron beam, a characteristic between the sample surface current at the position irradiated with the electron beam and the emission current. In other words, the characteristic between the sample surface current and the emission current at the set cathode temperature is acquired. The value of the sample surface current can be obtained as a current value of the multiple beams 20 detected by the Faraday cup 106. The value of the emission current can be obtained as a current value detected by the ammeter 238. Thereby, data of a characteristic graph as shown in FIG. 4 can be obtained. The obtained characteristic data is stored in the storage device 79.

Figure 5A:
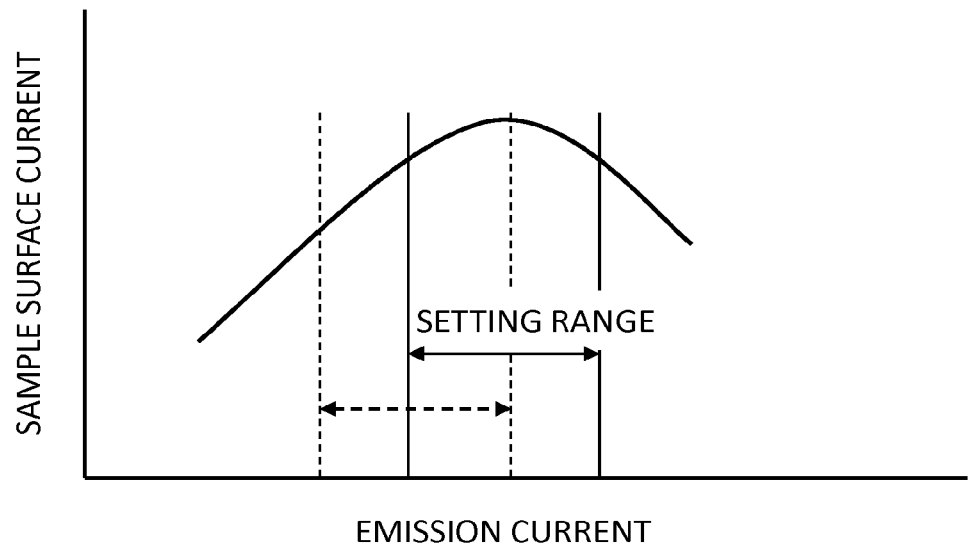
FIGS. 5A and 5B are examples showing a characteristic graph and a gradient value according to the first embodiment.
Figure 5B:
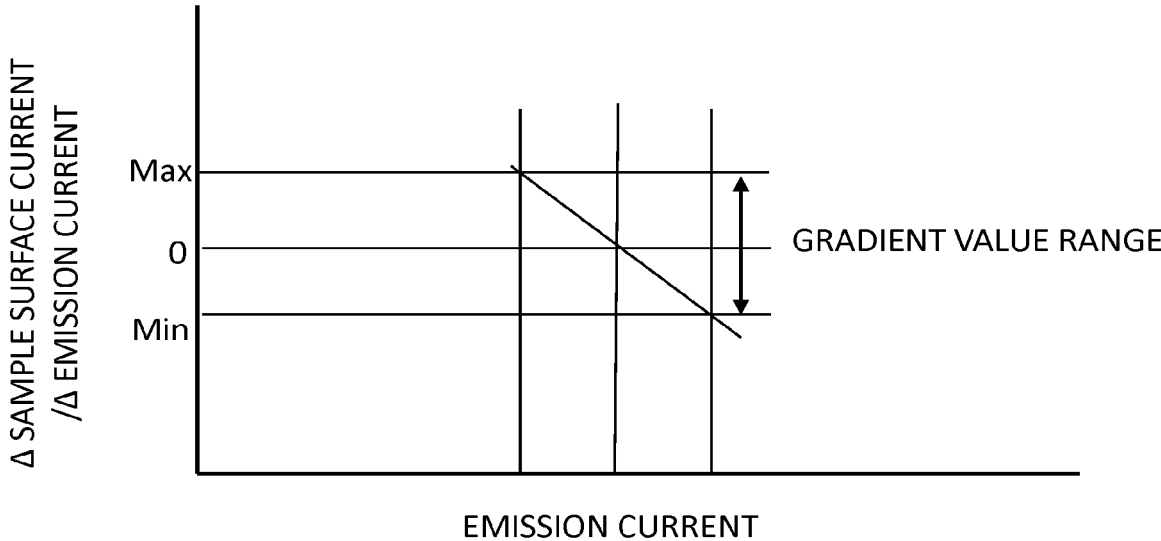

FIGS. 5A and 5B show examples of a characteristic graph and a gradient value according to the first embodiment. FIG. 5A shows a portion of a graph of characteristic between the sample surface current and the emission current. In the example of FIG. 5A, the range including the peak position is shown as a setting range (solid line) in the characteristic graph. For example, an emission current range centering the emission current at the peak position and including ±several percent to ±several tens percent (e.g., ±20 percent) of the emission current at the peak position is shown as a setting range. However, the setting range is not limited thereto. For example, it is also preferable to set the range whose upper limit is the emission current at the peak position, and lower limit is the emission current reduced from the emission current at the peak position by several percent to several tens percent (e.g., 40 percent) is set as a setting range (dotted line). Alternatively, it is also preferable to set the range whose upper limit is the emission current a little smaller than the emission current at the peak position, and lower limit is the emission current reduced from the emission current at the peak position by several percent to several tens percent (e.g., 40 percent).

Based on the characteristic, the gradient value calculation unit 62 calculates gradient values (differential values) each obtained by dividing the sample surface current by the emission current in the setting range (predetermined range) in the characteristic.

FIG. 5B shows as an example of a gradient value. In FIG. 5B, the ordinate axis represents a gradient value obtained by differentiating a sample surface current I by an emission current Emi, and the abscissa axis represents an emission current. The example of FIG. 5B shows a gradient value (differential value) of the characteristic graph obtained by dividing the sample surface current by the emission current in the setting range (solid line) of FIG. 5A. As shown in FIG. 5B, with respect to the setting range of FIG. 5A, the positive gradient of the rise of the characteristic graph decreases towards the peak, it becomes zero at the peak position, and it falls as a negative gradient after the peak position. Therefore, in the example of FIG. 5B, the gradient value is obtained where the gradient value at the lower limit of the emission current in the setting range is the maximum value (max), and the gradient value at the upper limit of the emission current in the setting range is the minimum value (min). Data of the calculated gradient values is stored in the storage device 79.

The gradient value calculation unit 64 calculates a gradient value Emislope (differential value) by differentiating, by the emission current Emi, the sample surface current I in the state where the electron beam 200 has been adjusted to reach the target value of the sample surface current.

Then, under the condition that the electron beam 200 has reached the target value of the sample surface current, the cathode temperature is adjusted so that the calculated gradient value Emislope may be in the range of the gradient value in the setting range of the characteristic. Specifically, under the condition that the electron beam 200 has reached the target value of the sample surface current, while lowering the cathode temperature step by step, it is adjusted to be the minimum of the cathode temperature under which the calculated gradient value Emislope is in the range of the gradient value in the setting range of the characteristic. By this, the cathode temperature can be brought close to the ideal cathode temperature shown in FIG. 4.

After completing the initial setting of the electron gun, the writing processing is started. Then, during the operation of the writing apparatus 100, in the electron gun power-supply device 120, a bias voltage B is controlled under the cathode temperature adjusted as described above so that the electron gun 201 may maintain the emission current Emi of the electron beam 200 in the state when the gradient value Emislope was calculated. However, if the cathode 222 is used continuously, the cathode characteristic changes due to the consumption (evaporation) of the cathode crystal, and therefore, each parameter value changes as described above.

FIG. 6 is a flowchart showing main steps of an example of a control method of a writing apparatus according to the first embodiment. In FIG. 6, the control method of the writing apparatus of the first embodiment executes a series of steps: a determination step (S102), a cathode temperature change step (S104), a parameter calculation step (S106), a recording step (S108), a lifetime estimation step (S110), a determination step (S112), and an alarm output step (S114).

The estimation/prediction method of the cathode lifetime of the electron gun according to the first embodiment executes the parameter calculation step (S106), the recording step (S108), and the lifetime estimation step (S110) in the steps described above.

In the determination step (S102), the determination unit 66 determines whether the gradient value Emislope obtained by differentiating the sample surface current I by the emission current Emi has decreased to a preset threshold Eth. Therefore, for every predetermined period, the current amount of the multiple beams 20 is detected by the Faraday cup 106 in order to measure the sample surface current I. The gradient value calculation unit 64 calculates a gradient value Emislope at each measurement of the sample surface current I. It is preferable to execute the determination step (S102) whenever the gradient value Emislope is calculated, for example.

Figures 7A, 7F:
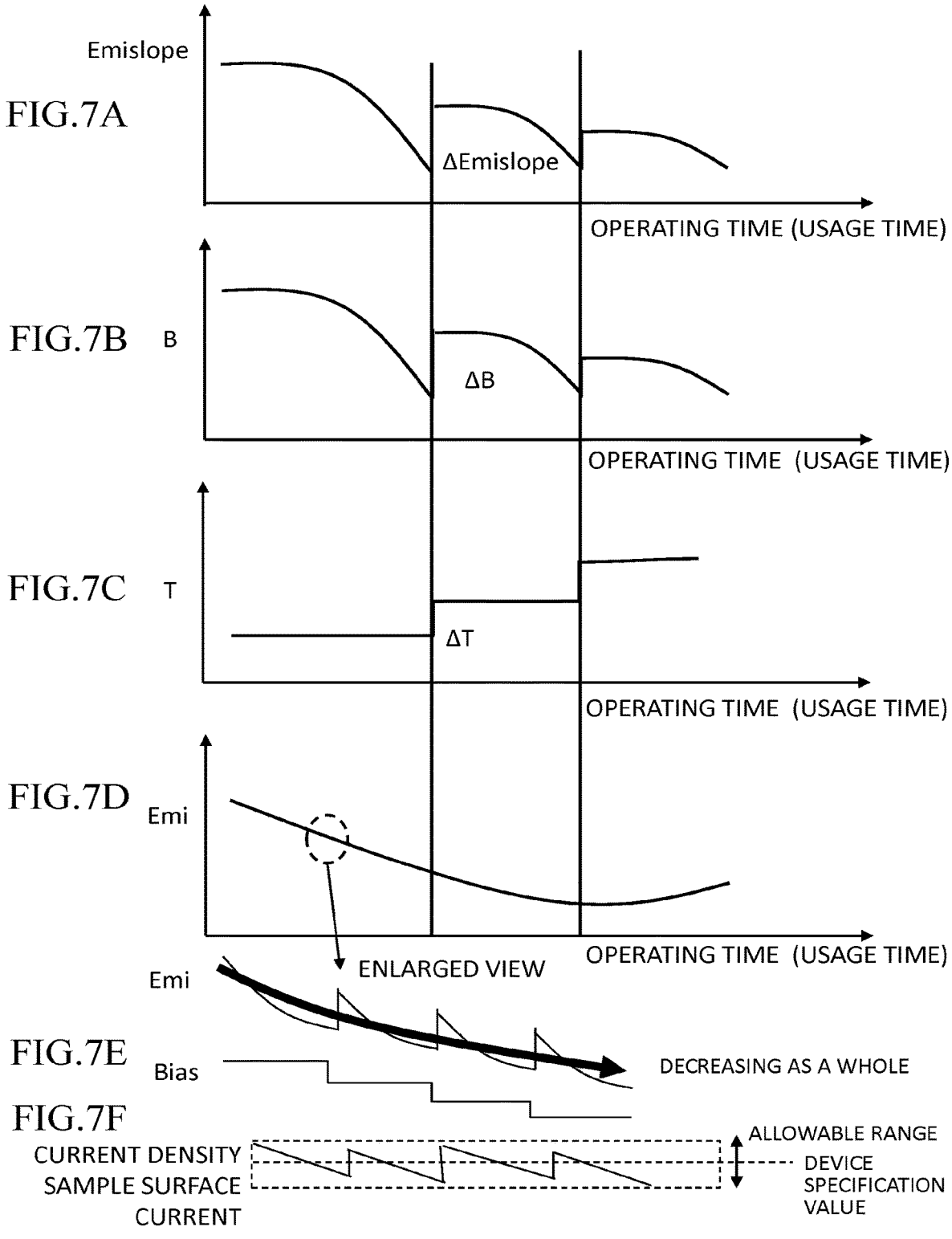

FIGS. 7A to 7F are graphs illustrating a change of each parameter in accordance with use of the cathode according to the first embodiment. In FIG. 7A, the ordinate axis represents a gradient value Emislope obtained by differentiating a sample surface current I by an emission current Emi, and the abscissa axis represents an operating time (usage time) of a cathode. In FIG. 7B, the ordinate axis represents a bias voltage B, and the abscissa axis represents an operating time (usage time) of a cathode. In FIG. 7C, the ordinate axis represents a cathode temperature T, and the abscissa axis represents an operating time (usage time) of a cathode. In FIG. 7D, the ordinate axis represents an emission current Emi, and the abscissa axis represents an operating time (usage time) of a cathode.

As shown in FIG. 7A, depending on the operating time (usage time) of the cathode, the gradient value Emislope obtained by differentiating the sample surface current I by the emission current Emi decreases and reaches the threshold Eth. As shown in FIG. 7F, the electron gun power-supply device 120 controls the bias voltage B so that the sample surface current I may become constant. As shown in FIG. 7B, when the gradient value Emislope decreases, since the bias voltage B control unit 74 controls such that the sample surface current is maintained at the control target value, the bias voltage B decreases.

In the cathode temperature change step (S104), when the gradient value Emislope decreases and reaches the threshold Eth, the filament power supply circuit 231 increases the cathode temperature T as shown in FIG. 7C. Thereby, the gradient value Emislope and the bias voltage B increase. Then, when the operating time (usage time) of the cathode further advances, the gradient value Emislope similarly decreases and reaches the threshold Eth. Since, similarly, the bias voltage B control unit 74 controls such that the sample surface current is maintained at the control target value even when the gradient value Emislope decreases, the bias voltage B decreases. Then, as shown in FIG. 7C, when the gradient value Emislope decreases and reaches the threshold Eth, the cathode temperature T is made to increase again. Thereby, the gradient value Emislope and the bias voltage B increase. This operation is repeatedly performed. The increase width (range) of the cathode temperature per operation is preferably set to be between 5° C. to 50° C. (e.g., 10° C.).

Although the above examples describe the case where, when the gradient value Emislope decreases and reaches the threshold Eth, the cathode temperature T is made to increase, it is not limited thereto. It is also preferable to increase, for every predetermined period, the cathode temperature T. For example, it is preferable to increase the cathode temperature T for every one to four weeks (e.g., for every two weeks).

When increasing the cathode temperature, the change amount ΔEmislope of the gradient value Emislope decreases in accordance with the passage of the operating time (usage time) of the cathode. In other words, the change amount ΔEmislope of the gradient value Emislope, where the change amount is per unit temperature increase of the cathode 222, decreases gradually in accordance with the passage of the operating time (usage time) of the cathode 222, and, in due course, even when the cathode temperature is increased, the gradient value Emislope becomes not increasing. That is, the change amount ΔEmislope becomes zero. Similarly, the change amount ΔB of the bias voltage B in the case of increasing the cathode temperature decreases in accordance with the passage of the operating time (usage time) of the cathode. In other words, the change amount ΔB of the bias voltage B, where the change amount is per unit temperature increase of the cathode 222, decreases gradually in accordance with the passage of the operating time (usage time) of the cathode, and, by and by, becomes zero.

In contrast, although the decrease amount of the emission current Emi is large at the beginning, the decrease amount becomes small in accordance with the passage of the operating time (usage time) of the cathode, and by and by the emission current Emi becomes not decreasing. After then, the emission current Emi turns into increasing.

Figure 8:
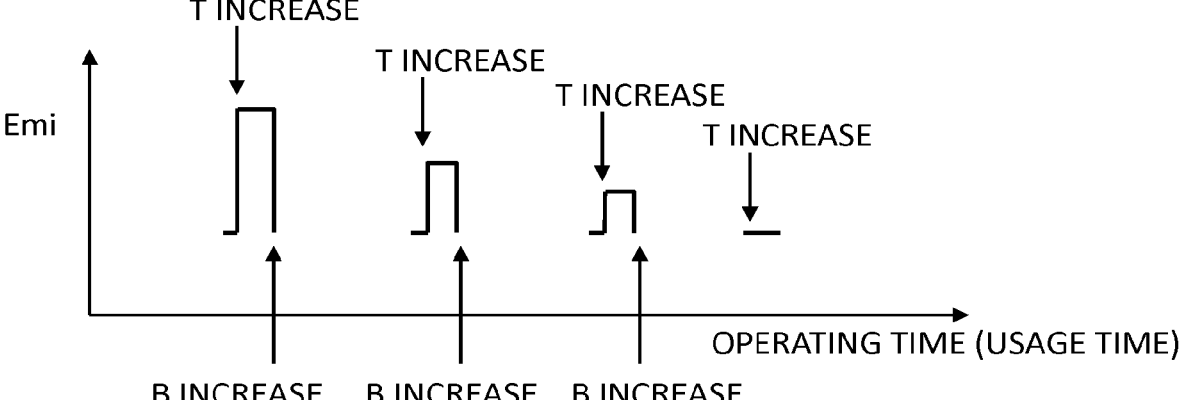
FIG. 8 is an illustration for explaining the state of an emission current at the time of changing the cathode temperature according to the first embodiment.

FIG. 8 is an illustration for explaining the state of an emission current at the time of changing the cathode temperature according to the first embodiment. The ordinate axis represents an emission current Emi, and the abscissa axis represents an operating time (usage time).

In the change of the cathode characteristic, the emission current Emi changes in accordance with that the control value of the sample surface current I is maintained by adjustment of the bias voltage B. Then, when the gradient value Emislope decreases to the threshold Eth, the cathode temperature T is increased by a predetermined increase width. By this, as shown in FIG. 8, although the emission current Emi increases, since the bias voltage B control unit 74 controls such that the sample surface current I is adjusted to be a control target value by increasing the bias voltage B, the emission current Emi decreases. Therefore, as shown in FIG. 7B, when the cathode temperature T is changed (increased), the bias voltage B increases. At this stage, as shown in FIG. 8, the change amount (increase width) of the emission current Emi at the second increasing of the cathode temperature is smaller than that at the first increasing of the cathode temperature. The change amount (increase width) of the emission current Emi at the third increasing of the cathode temperature is further smaller. Then, when a long usage time of the cathode 222 passes, the emission current Emi becomes not increasing even if the cathode temperature is increased. Therefore, the control width (increase width) of the bias voltage B also becomes small in accordance with the number of times of changing the cathode temperature, and, by and by, becomes zero.

As shown in FIG. 7E, since the emission current is changed by changing the bias voltage, the sample surface current I is maintained at a fixed control target value as shown in FIG. 7F. At this process, as shown in the enlarged part of FIG. 7D, although the emission current Emi changes in accordance with the adjustment of the bias voltage shown in FIG. 7E, it decreases as a whole. Then, although the sample surface current I increases by the first increasing of the cathode temperature, the bias voltage is changed to maintain the sample surface current to be constant, and, as a result, the emission current is returned close to the original value. With respect also to the sample surface current I, similar to the emission current shown in FIG. 8, the change amount (increase width) of the sample surface current I at the second increasing of the cathode temperature is smaller than that at the first increasing of the cathode temperature. The change amount (increase width) of the sample surface current I at the third increasing of the cathode temperature is further smaller. Then, when a long usage time of the cathode 222 passes, the sample surface current I becomes not increasing even when the cathode temperature is increased.

The current density J can be obtained by dividing the sample surface current I by the total of aperture areas of the holes 22 for measured beams in a plurality of holes 22 of the shaping aperture array substrate 203. Therefore, as shown in FIG. 7F, the current density J shows the same behavior as that of the sample surface current I. The same applies to the case of changing the cathode temperature. Specifically, the current density J decreases in accordance with change (retreat of the cathode crystal due to evaporation) of the cathode characteristic. Then, the current density J increases by the first increasing of the cathode temperature. Similar to the emission current shown in FIG. 8, the change amount (increase width) of the current density J at the second increasing of the cathode temperature is smaller than that at the first increasing of the cathode temperature. The change amount (increase width) of the current density J at the third increasing of the cathode temperature is further smaller. Then, when a long usage time of the cathode 222 passes, the current density J becomes not increasing even when the cathode temperature is increased.

In the parameter calculation step (S106), the parameter calculation unit 54 calculates, for each change of the cathode temperature, the value of each parameter. Specifically, the parameter calculation unit 54 calculates the sample surface current I. The method for calculation is as described above. In other words, the current amount of the multiple beams 20 is measured, for each change of the cathode temperature, by the Faraday cup 106. The calculated value of the sample surface current I is output to the control computer 232. The parameter calculation unit 54 calculates the current density J. The gradient value calculation unit 64 calculates the gradient value Emislope at the time of changing the cathode temperature. The bias voltage value B at the time of adjustment due to the change of the cathode temperature is output from the B control unit 74. The cathode temperature can be read from the cathode temperature T control unit 76. The value of the emission current Emi can be read from the ammeter 238.

Next, the parameter calculation unit 55 calculates, for each increase of the cathode temperature of the electron gun 201, a change amount, per unit temperature increase of the cathode, with respect to each parameter. Specifically, for example, the parameter calculation unit 55 calculates, for each increase of the cathode temperature, a change amount dEmislope/dT (differential value), per unit temperature increase of the cathode, with respect to the gradient value Emislope obtained by differentiating the sample surface current I at the position on the sample surface irradiated with the electron beam 200 (multiple beams 20) by the emission current Emi of the electron beam.

Alternatively or/and additionally, for example, the parameter calculation unit 55 calculates, for each increase of the cathode temperature, a change amount dB/dT (differential value), per unit temperature increase of the cathode 222, with respect to the bias voltage B to be applied to the Wehnelt 224 of the electron gun 201.

Alternatively or/and additionally, for example, the parameter calculation unit 55 calculates, for each increase of the cathode temperature, a change amount dI/dT (differential value), per unit temperature increase of the cathode 222, with respect to the sample surface current I at the position on the sample surface irradiated with an electron beam.

Alternatively or/and additionally, for example, the parameter calculation unit 55 calculates, for each increase of the cathode temperature, a change amount dJ/dT (differential value), per unit temperature increase of the cathode 222, with respect to the current density J at the position on the sample surface irradiated with an electron beam.

Alternatively or/and additionally, for example, the parameter calculation unit 55 calculates a change amount dEmi/dt (differential value), per unit time dt, with respect to the emission current Emi of an electron beam emitted from the electron gun 201.

In the recording step (S108), the recording unit 56 records a change amount with respect to each parameter value, which is per unit temperature increase of the cathode 222 and calculated for each change of the cathode temperature, to be recorded in relation to the usage time of the cathode 222.

For example, the recording unit 56 records a change amount dEmislope/dT with respect to the gradient value Emislope, which is per unit temperature increase of the cathode 222 and calculated for each change of the cathode temperature, to be recorded in relation to the usage time of the cathode 222.

Alternatively or/and additionally, for example, the recording unit 56 records a change amount dB/dT with respect to the bias voltage B, which is per unit temperature increase of the cathode 222 and calculated for each change of the cathode temperature, to be recorded in relation to the usage time of the cathode 222.

Alternatively or/and additionally, for example, the recording unit 56 records a change amount dI/dT with respect to the sample surface current I, which is per unit temperature increase of the cathode 222 and calculated for each change of the cathode temperature, to be recorded in relation to the usage time of the cathode 222.

Alternatively or/and additionally, for example, the recording unit 56 records a change amount dJ/dT with respect to the current density J, which is per unit temperature increase of the cathode 222 and calculated for each change of the cathode temperature, to be recorded in relation to the usage time of the cathode 222.

Alternatively or/and additionally, for example, the recording unit 56 records a cathode temperature of the electron gun 201 which emits the electron beam 200, to be recorded in relation to the usage time of the cathode 222. The cathode temperature may be read from the cathode temperature T control unit 76.

Alternatively or/and additionally, for example, the recording unit 56 records a change amount ΔEmi/dt, per unit time dt, with respect to the emission current Emi of the electron beam 200 emitted from the electron gun 201, to be recorded in relation to the usage time of the cathode of the electron gun 201. The value of the emission current Emi can be read from the ammeter 238.

Figure 9:
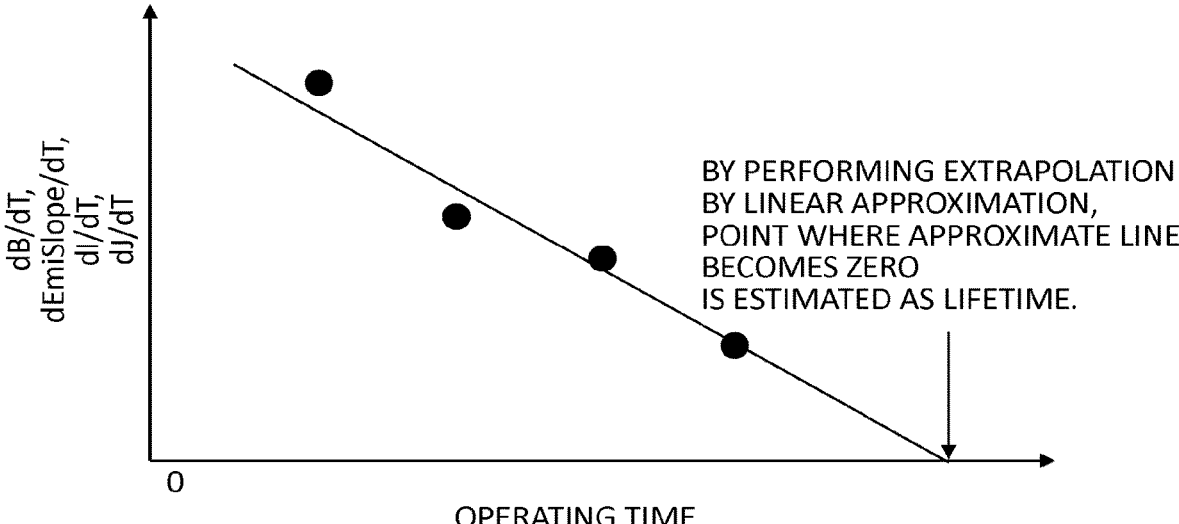
FIG. 9 is an example of a graph for explaining a change amount, per unit temperature increase of a cathode, with respect to each parameter according to the first embodiment.

FIG. 9 is an example of a graph for explaining a change amount, per unit temperature increase of the cathode, with respect to each parameter according to the first embodiment. In FIG. 9, the ordinate axis represents a change amount dEmislope/dT, per unit temperature increase of the cathode, with respect to the gradient value Emislope, a change amount dB/dT, per unit temperature increase of the cathode, with respect to the bias voltage B, a change amount dI/dT, per unit temperature increase of the cathode, with respect to the sample surface current I, or a change amount dJ/dT, per unit temperature increase of the cathode, with respect to the current density J. The abscissa axis represents an operating time (usage time of the cathode 222) of the electron gun 201. FIG. 9 shows the case where data plotting each parameter recorded for each temperature change of the cathode 222 is used. Further, FIG. 9 shows the case where each parameter recorded a plurality of times is approximated by a linear function.

As shown in FIG. 9, the change amount dEmislope/dT, per unit temperature increase of the cathode, with respect to the gradient value Emislope decreases in accordance with the passage of the operating time (usage time of the cathode 222) of the electron gun 201. Similarly, the change amount dB/dT, per unit temperature increase of the cathode 222, with respect to the bias voltage B decreases in accordance with the passage of the operating time (usage time of the cathode 222) of the electron gun 201. Similarly, the change amount dI/dT, per unit temperature increase of the cathode 222, with respect to the sample surface current I decreases in accordance with the passage of the operating time (usage time of the cathode 222) of the electron gun 201. Similarly, the change amount dJ/dT, per unit temperature increase of the cathode 222, with respect to the current density J decreases in accordance with the passage of the operating time (usage time of the cathode 222) of the electron gun 201. Then, according to the first embodiment, based on the behavior of each parameter shown in FIG. 9, the lifetime of the cathode 222 is estimated/predicted.

In the lifetime estimation step (S110), using an approximate line obtained by approximating the change amount dEmislope/dT, per unit temperature increase of the cathode, with respect to the recorded gradient value Emislope, the estimation unit 58 estimates the time at which the change amount dEmislope/dT becomes zero, and estimates (or "regards") the estimated time as the lifetime of the cathode 222. A linear approximation cannot be performed using only data at the first changing of the temperature of the cathode 222. Therefore, starting from the second changing the temperature of the cathode 222, for each temperature change of the cathode 222, the lifetime of the cathode 222 is re-estimated to be updated. Alternatively, it is also preferable that the first data plots the change amount dEmislope/dT which can be obtained experientially, and then, starting from the first changing of the temperature of the cathode 222, for each temperature change of the cathode 222, the lifetime of the cathode 222 is estimated.

Alternatively or/and additionally, using an approximate line obtained by approximating the change amount dB/dT, per unit temperature increase of the cathode 222, with respect to the recorded bias voltage B, the estimation unit 58 estimates the time at which the change amount dB/dT becomes zero, and estimates (or "regards") the estimated time as the lifetime of the cathode. A linear approximation cannot be performed using only data at the first changing of the temperature of the cathode 222. Therefore, starting from the second changing of the temperature of the cathode 222, for each temperature change of the cathode 222, the lifetime of the cathode 222 is re-estimated to be updated. Alternatively, it is also preferable that the first data plots the change amount dB/dT which can be obtained experientially, and then, starting from the first changing of the temperature of the cathode 222, for each temperature change of the cathode 222, the lifetime of the cathode 222 is estimated.

Alternatively or/and additionally, using an approximate line obtained by approximating the change amount dI/dT, per unit temperature increase of the cathode 222, with respect to the recorded sample surface current I, the estimation unit 58 estimates the time at which the change amount dI/dT becomes zero, and estimates (or "regards") the estimated time as the lifetime of the cathode 222. A linear approximation cannot be performed using only data at the first changing the temperature of the cathode 222. Therefore, starting from the second changing of the temperature of the cathode 222, for each temperature change of the cathode 222, the lifetime of the cathode 222 is re-estimated to be updated. Alternatively, it is also preferable that the first data plots the change amount dI/dT which can be obtained experientially, and then, starting from the first changing of the temperature of the cathode 222, for each temperature change of the cathode 222, the lifetime of the cathode 222 is estimated.

Alternatively or/and additionally, using an approximate line obtained by approximating the change amount dJ/dT, per unit temperature increase of the cathode 222, with respect to the recorded current density J, the estimation unit 58 estimates the time at which the change amount dJ/dT becomes zero, and estimates (or "regards") the estimated time as the lifetime of the cathode 222. A linear approximation cannot be performed using only data at the first changing of the temperature of the cathode 222. Therefore, starting from the second changing of the temperature of the cathode 222, for each temperature change of the cathode 222, the lifetime of the cathode 222 is re-estimated to be updated. Alternatively, it is also preferable that the first data plots the change amount dJ/dT which can be obtained experientially, and then, starting from the first changing of the temperature of the cathode 222, for each temperature change of the cathode 222, the lifetime of the cathode 222 is estimated.

Figure 10:
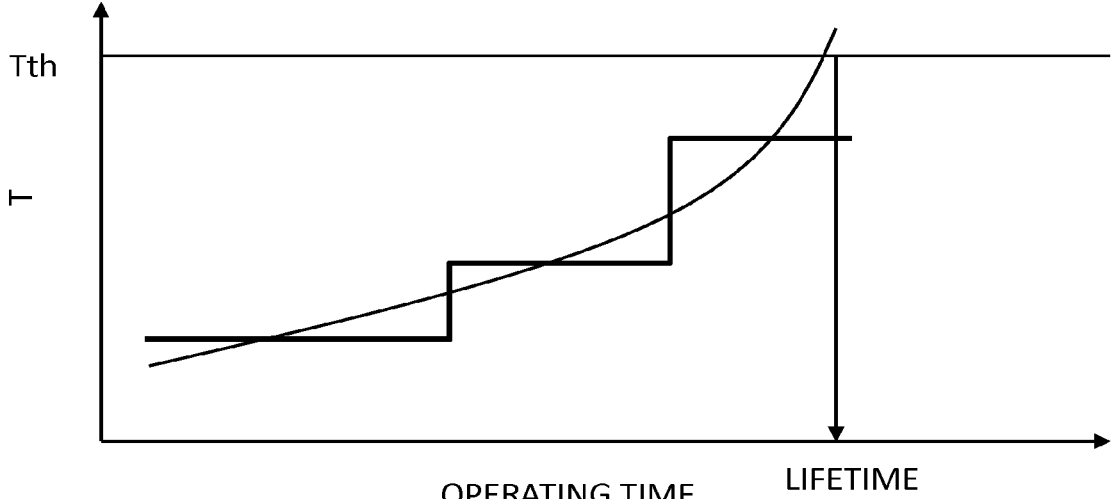
FIG. 10 is an example of a graph showing a transition of a change of a cathode temperature according to the first embodiment.

FIG. 10 is an example of a graph showing a transition of a change of a cathode temperature according to the first embodiment. In FIG. 10, the ordinate axis represents a cathode temperature T, and the abscissa axis represents an operating time (usage time of the cathode 222) of the electron gun 201. For each change of the cathode temperature, the cathode temperature T increases by a predetermined increase width (range), and a fixed temperature is maintained until the next change.

As another example of the lifetime estimation step (S110), for example, using an approximate line obtained by approximating the recorded cathode temperature change, the estimation unit 58 estimates the time at which the cathode temperature reaches the threshold Tth, and estimates (or "regards") the estimated time as the lifetime of the cathode 222. FIG. 10 shows the case where a recorded cathode temperature T is approximated by a quadratic function or an exponential function. For example, it is preferable to perform fitting of the cathode temperature at the middle time between each changing time of the cathode temperature and its one previous changing time of the cathode temperature. A linear approximation cannot be performed using only data at the first changing of the temperature of the cathode 222. Therefore, starting from the second changing of the temperature of the cathode 222, for each temperature change of the cathode 222, the lifetime of the cathode 222 is re-estimated to be updated.

Figure 11:
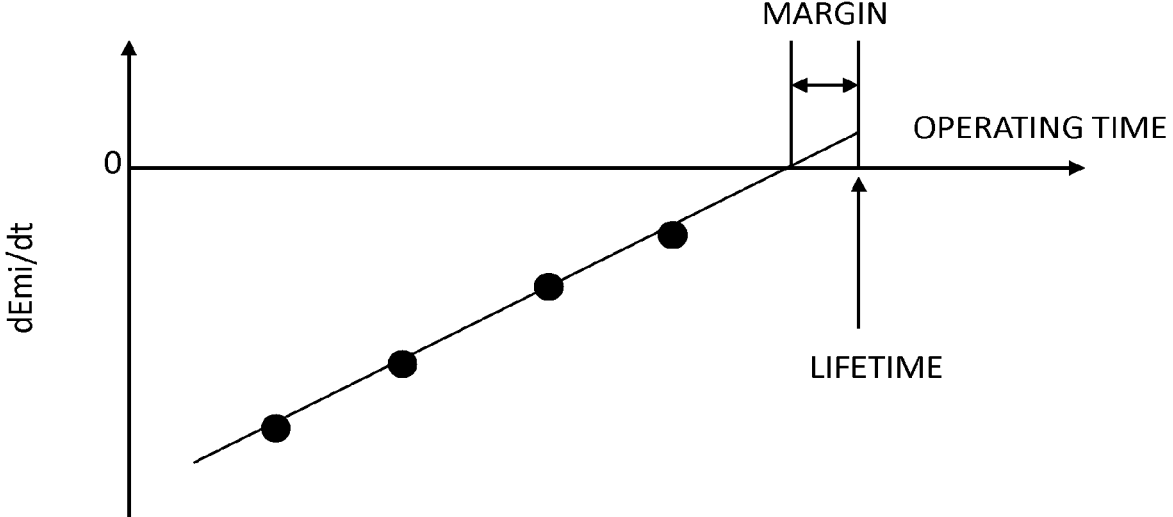
FIG. 11 is an example of a graph for explaining a change amount, per unit time, with respect to an emission current according to the first embodiment.

FIG. 11 is an example of a graph for explaining a change amount, per unit time, with respect to an emission current according to the first embodiment. In FIG. 11, the ordinate axis represents a change amount ΔEmi/dt, per unit time dt, with respect to the emission current Emi, and the abscissa axis represents an operating time (usage time of the cathode 222) of the electron gun 201. FIG. 11 shows the case where data plotting the change amount ΔEmi/dt recorded for each temperature change of the cathode 222 is used. Further, FIG. 11 shows the case where each parameter recorded a plurality of times is approximated by a linear function. As shown in 7D, although the decrease amount is large at the beginning, the decrease amount becomes small in accordance with the passage of the operating time (usage time) of the cathode, and by and by becomes not decreasing. After then, the change amount ΔEmi of the emission current turns into increasing. Therefore, the change amount ΔEmi/dt changes from a negative value to zero. Then, after reaching zero, it turns into a positive value.

As another example of the lifetime estimation step (S110), for example, using an approximate line obtained by approximating the recorded change amount dEmi/dt, the estimation unit 58 estimates the time at which the change amount dEmi/dt becomes zero, and estimates (or "regards") the time obtained by adding a margin to the estimated time, as the lifetime of the cathode 222. Here, it is preferable to use several days to several weeks (e.g., two weeks) as the margin, for example. The margin may be set by experiment or the like.

In the examples described above, as the parameter for estimating the lifetime of the cathode 222, the change amount dEmislope/dT of the gradient value Emislope, the change amount dB/dT of the bias voltage B, the change amount dI/dT of the sample surface current I, the change amount dJ/dT of the current density J, the cathode temperature T, and the change amount dEmi/dt of the emission current Emi are explained. The cathode lifetime can be estimated by using all these parameters or two or more ones. It is preferable to estimate the cathode lifetime by using any one of the parameters. The estimated lifetime of the cathode 222 is stored in the storage device 140.

In the determination step (S112), the alarm processing unit 59 reads the latest estimated lifetime of the cathode 222 from the storage device 140, and determines whether the estimated lifetime approaches. For example, it is determined whether the remaining period of the lifetime has reached a predetermined period of several days to several weeks (e.g., two weeks). If the remaining period of the lifetime has not reached a predetermined period tth, it returns to the determination step (S102) to repeat each step described above. When the remaining period of the lifetime reaches the predetermined period tth, it proceeds to the alarm output step (S114).

In the alarm output step (S114), when the estimated lifetime end is approaching, the alarm processing unit 59 (an example of an output unit) outputs information indicating that the lifetime is coming to an end soon. For example, the monitor 114 (another example of the output unit) displays the information indicating that the lifetime end comes very soon. It is preferable to display, as the information indicating an approach of the lifetime end, an alarm indication, remaining days, or the like.

Next, writing processing method will be described. The writing data processing unit 40 reads writing data stored in the storage device 140, and generates writing time data to perform writing with multiple beams. The writing control unit 42 rearranges irradiation time data in the order of shot in accordance with the writing sequence. Then, the irradiation time data is transmitted to the deflection control circuit 130 in the order of shot. The deflection control circuit 130 outputs deflection control signals to the DAC amplifier units 132 and 134 in the order of shot while outputting a blanking control signal to the blanking aperture array mechanism 204 in the order of shot. The writing mechanism 150 controlled by the writing control unit 42 writes a pattern on the sample 101, using an electron beam having been beam-adjusted.

Figure 12:
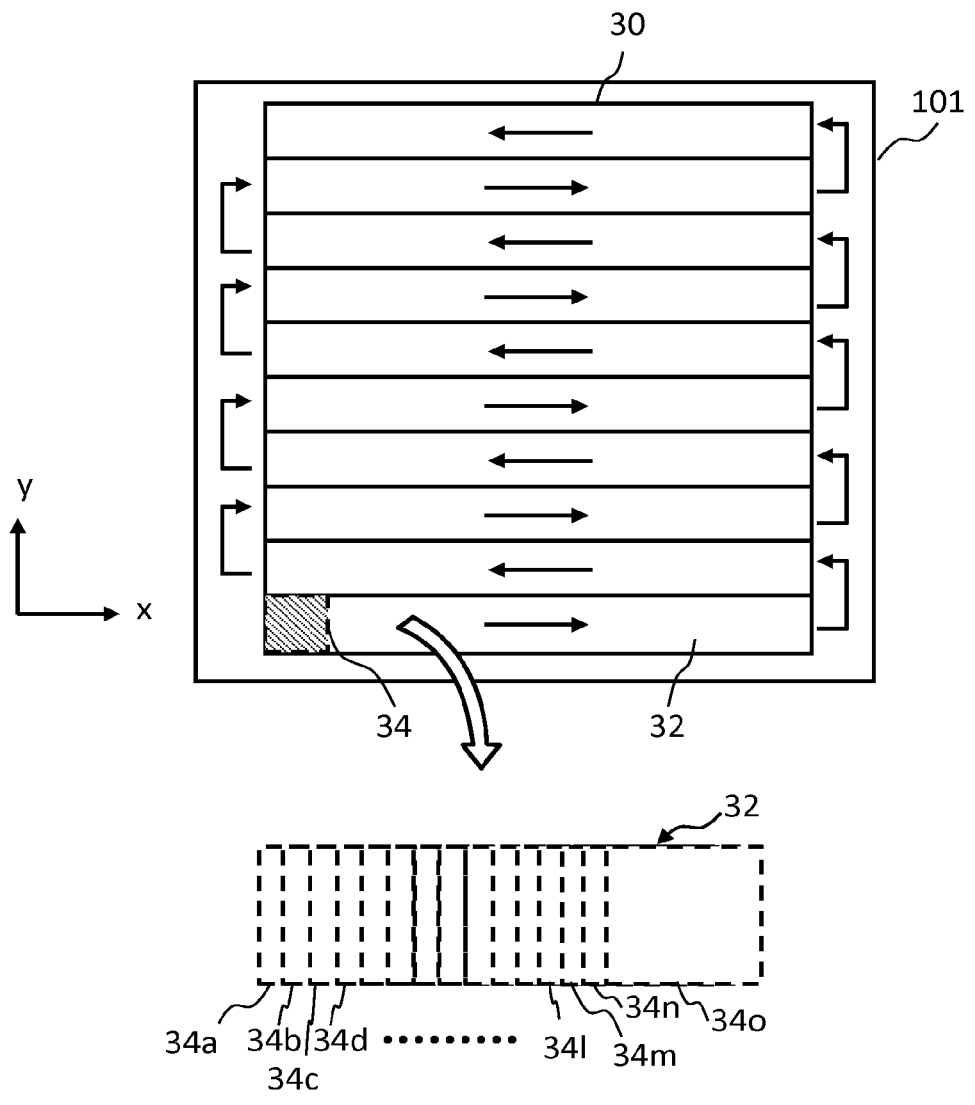
FIG. 12 is a conceptual diagram illustrating an example of a writing operation according to the first embodiment.

FIG. 12 is a conceptual diagram illustrating an example of a writing operation according to the first embodiment. As shown in FIG. 12, a writing region 30 of the sample 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. Further, although FIG. 12 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 13:
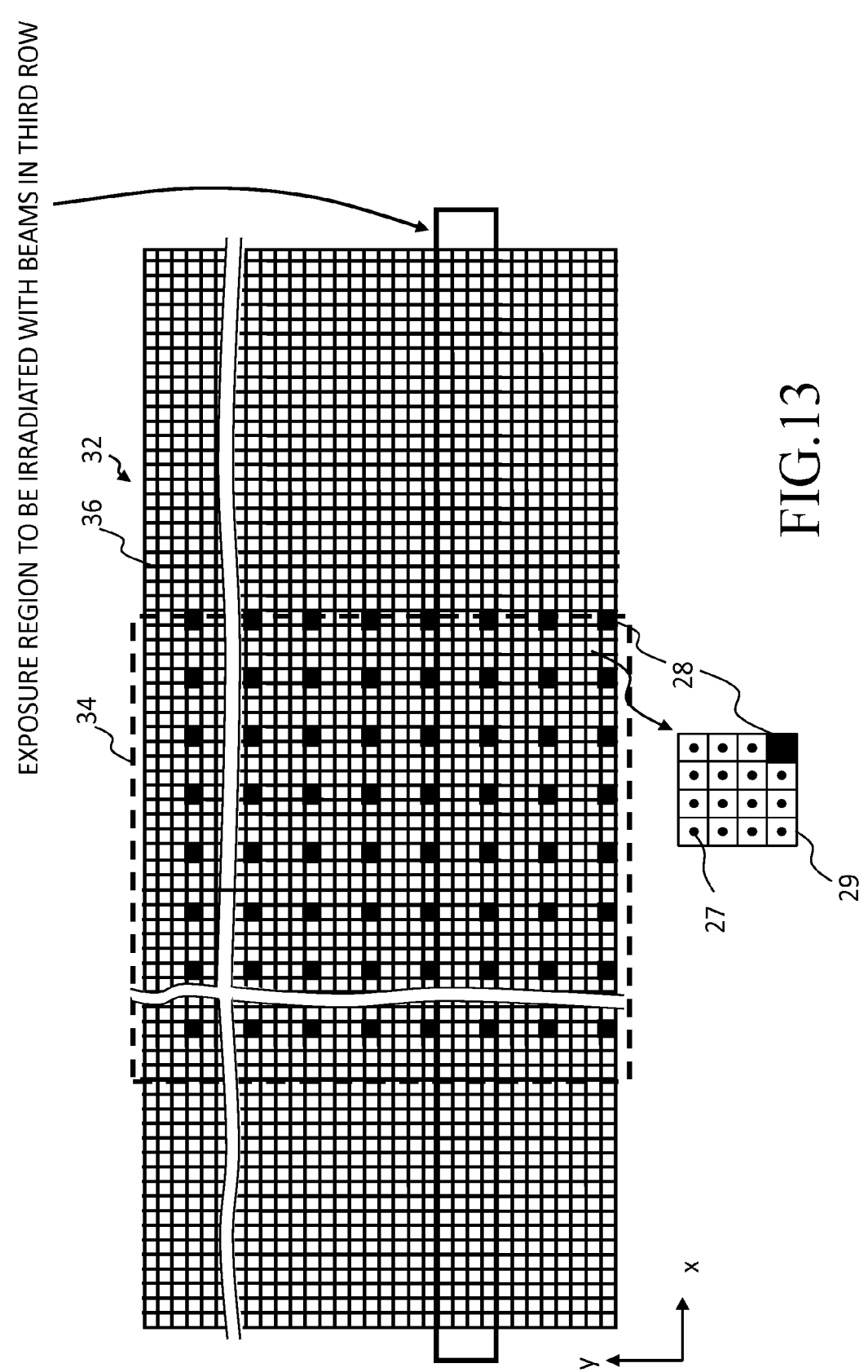
FIG. 13 is a diagram showing an example of an irradiation region of multiple beams and a writing target pixel according to the first embodiment.

FIG. 13 is a diagram showing an example of an irradiation region of multiple beams and a pixel to be written (writing target pixel) according to the first embodiment. In FIG. 13, in the stripe region 32, there are set a plurality of control grids 27 (design grids) arranged in a grid form at the beam size pitch of the multiple beams 20 on the surface of the sample 101, for example. Preferably, they are arranged at a pitch of around 10 nm. The plurality of control grids 27 serve as design irradiation positions of the multiple beams 20. The arrangement pitch of the control grid 27 is not limited to the beam size, and may be any size that can be controlled as a deflection position of the deflector 209 regardless of the beam size. Then, a plurality of pixels 36, each of which is centering on each control grid 27, are set by virtually dividing into a mesh form by the same size as that of the arrangement pitch of the control grid 27. Each pixel 36 serves as an irradiation unit region per beam of the multiple beams. FIG. 11 shows the case where the writing region of the sample 101 is divided, for example, in the y direction, into a plurality of stripe regions 32 by the width size being substantially the same as the size of the irradiation region 34 (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 13 shows the case where the multiple beams of 512×512 (rows×columns) are simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 13, one sub-irradiation region 29 is a region surrounded by beam pitches. In the case of FIG. 13, each sub-irradiation region 29 is composed of 4×4 pixels.

Figure 14:
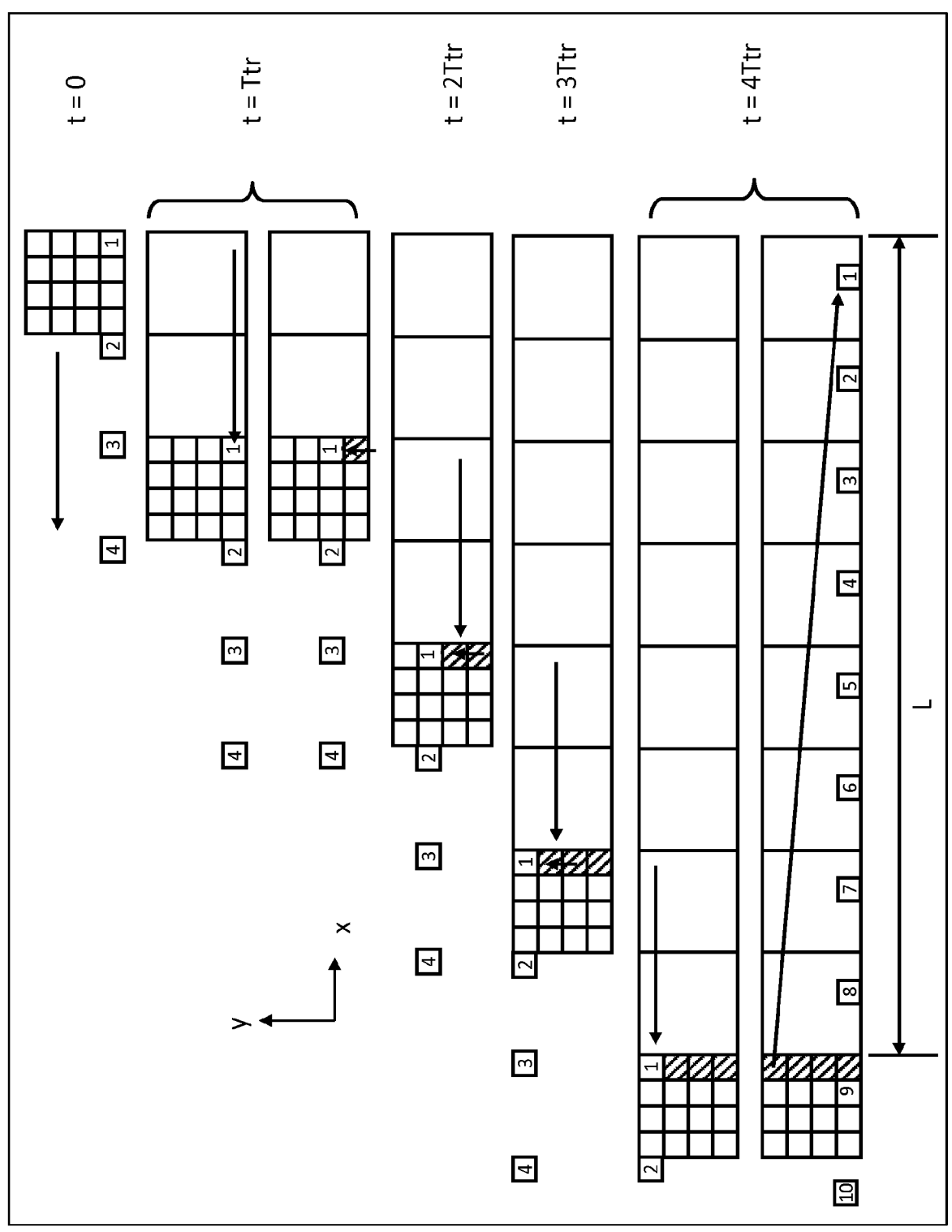
FIG. 14 is a diagram illustrating an example of a writing method of multiple beams according to the first embodiment.

FIG. 14 is a diagram illustrating an example of a writing method of multiple beams according to the first embodiment. FIG. 14 shows a portion of the sub-irradiation region 29 to be written by each of beams at the coordinates (1, 3), (2, 3), (3, 3), . . . , (512, 3) in the y-direction third row from the bottom in the multiple beams for writing the stripe region 32 shown in FIG. 12. In the example of FIG. 14, while the XY stage 105 moves the distance of eight beam pitches, four pixels are written (exposed), for example. In order that the relative position between the irradiation region 34 and the sample 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the cases of FIGS. 7A to 7F, one tracking cycle is executed by writing (exposing) four pixels while shifting, per shot, the irradiation target pixel 36 in the y direction during a movement by the distance of eight beam pitches.

Specifically, the writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each beam of the multiple beams of the shot concerned. The maximum irradiation time Ttr is set in advance. Although the time obtained by adding a settling time of beam deflection to the maximum irradiation time Ttr actually serves as a shot cycle, the settling time of beam deflection is omitted here to indicate the maximum irradiation time Ttr as the shot cycle. After one tracking cycle is completed, the tracking control is reset so as to swing back (return) the tracking position to the starting position of a next tracking cycle.

Since writing of the pixels in the first column from the right of each sub-irradiation region 29 has been completed, in the next tracking cycle after resetting the tracking, first, the deflector 209 performs deflection such that the writing position of each corresponding beam is adjusted (shifted) to the control grid 27 of the pixel at the bottom row in the second column from the right of each sub-irradiation region 29.

As described above, in the state where the relative position of the irradiation region 34 to the sample 101 is controlled by the deflector 208 to be the same (unchanged) position during the same tracking cycle, each shot is carried out while performing shifting from a control grid 27 (a pixel 36) to another control grid 27 (another pixel 36) by the deflector 209. Then, after finishing one tracking cycle and returning the tracking position of the irradiation region 34, the first shot position is adjusted to the position shifted by, for example, one control grid (one pixel) as shown in the lower part of FIG. 12, and each shot is performed shifting from one control grid (one pixel) to another control grid (another pixel) by the deflector 209 while executing a next tracking control. By repeating this operation during writing the stripe region 32, the position of the irradiation region 34 is shifted sequentially, such as from 34a to 34o, to perform writing of the stripe region concerned.

Based on the writing sequence, it is determined which beam of the multiple beams irradiates which control grid 27 (pixel 36) on the sample 101. Supposing that the sub-irradiation region 29 is a region composed of n×n pixels, n control grids (n pixels) are written by one tracking operation. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other sub-irradiation regions 29 each composed of n×n pixels in the irradiation region of multiple beams, the same operation is executed at the same time so as to perform writing similarly.

Measuring the sample surface current and changing the cathode temperature described above are performed at the time when the sample 101 is not being written. For example, they are performed after completing writing a certain sample and before starting writing the next sample. Alternatively, even after starting writing the sample and before finishing the writing it, they are performed after completing writing the stripe region 32 and before starting writing the next stripe region 32.

Although the above examples describe the case where, using an approximate line, the time at which each change amount becomes zero is estimated as the cathode lifetime, it is not limited thereto.

Figure 15:
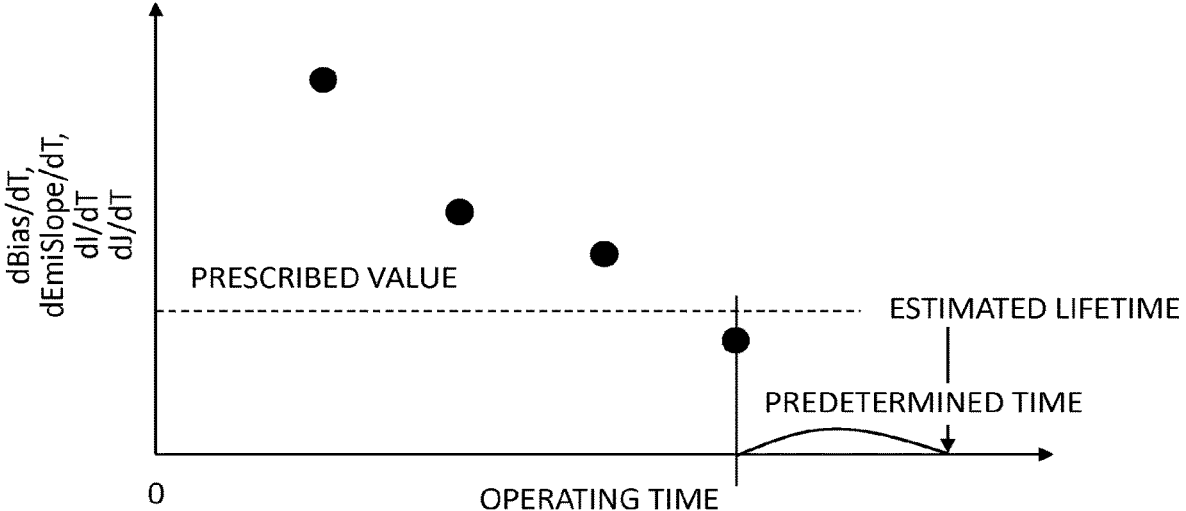
FIG. 15 is an example of a graph for explaining a change amount, per unit temperature increase of a cathode, with respect to each parameter according to a modified example of the first embodiment.

FIG. 15 is an example of a graph for explaining a change amount, per unit temperature increase of a cathode, with respect to each parameter according to a modified example of the first embodiment. In FIG. 15, the ordinate axis represents a change amount dEmislope/dT, per unit temperature increase of the cathode 222, with respect to the gradient value Emislope, a change amount dB/dT, per unit temperature increase of the cathode 222, with respect to the bias voltage B, a change amount dI/dT, per unit temperature increase of the cathode 222, with respect to the sample surface current I, or a change amount dJ/dT, per unit temperature increase of the cathode 222, with respect to the current density J. The abscissa axis represents an operating time (usage time of the cathode 222) of the electron gun 201. FIG. 15 shows the case where data plotting each parameter recorded for each temperature change of the cathode 222 is used.

As shown in FIG. 15, the change amount dEmislope/dT, per unit temperature increase of the cathode 222, with respect to the gradient value Emislope decreases in accordance with the passage of the operating time (usage time of the cathode 222) of the electron gun 201. Similarly, the change amount dB/dT, per unit temperature increase of the cathode 222, with respect to the bias voltage B decreases in accordance with the passage of the operating time (usage time of the cathode 222) of the electron gun 201. Similarly, the change amount dI/dT, per unit temperature increase of the cathode 222, with respect to the sample surface current I decreases in accordance with the passage of the operating time (usage time of the cathode 222) of the electron gun 201. Similarly, the change amount dJ/dT, per unit temperature increase of the cathode 222, with respect to the current density J decreases in accordance with the passage of the operating time (usage time of the cathode 222) of the electron gun 201.

According to the modified example of the first embodiment, based on the behavior of each parameter shown in FIG. 15, the lifetime of the cathode 222 is estimated/predicted.

In the lifetime estimation step (S110), the estimation unit 58 estimates, as the lifetime, the time obtained by adding a predetermined time to the time at which the change amount dEmislope/dT, per unit temperature increase of the cathode 222, with respect to the recorded gradient value Emislope becomes a prescribed value. It is preferable to use, for example, about ten days as the predetermined time. It is also preferable, for each temperature change of the cathode 222 from the first changing of the temperature of the cathode 222, to plot the change amount dEmislope/dT per unit temperature increase of the cathode, and, when the change amount dEmislope/dT becomes equal to or less than a prescribed value, to estimate the time obtained by adding a predetermined time to the prescribed value, as the lifetime.

Alternatively or/and additionally, the estimation unit 58 estimates, as the lifetime, the time obtained by adding a predetermined time to the time at which the change amount dB/dT, per unit temperature increase of the cathode 222, with respect to the recorded bias voltage B becomes a prescribed value. It is preferable to use, for example, about ten days as the predetermined time. It is also preferable, for each temperature change of the cathode 222 from the first changing of the temperature of the cathode 222, to plot the change amount dB/dT, per unit temperature increase of the cathode, and, when the change amount dB/dT becomes equal to or less than a prescribed value, to estimate the time obtained by adding a predetermined time to the prescribed value, as the lifetime.

Alternatively or/and additionally, the estimation unit 58 estimates, as the lifetime, the time obtained by adding a predetermined time to the time at which the change amount dI/dT, per unit temperature increase of the cathode 222, with respect to the recorded sample surface current I becomes a prescribed value. It is preferable to use, for example, about ten days as the predetermined time. It is also preferable, for each temperature change of the cathode 222 from the first changing of the temperature of the cathode 222, to plot the change amount dI/dT per unit temperature increase of the cathode, and, when the change amount dI/dT becomes equal to or less than a prescribed value, to estimate the time obtained by adding a predetermined time to the prescribed value, as the lifetime.

Alternatively or/and additionally, the estimation unit 58 estimates, as the lifetime, the time obtained by adding a predetermined time to the time at which the change amount dJ/dT, per unit temperature increase of the cathode 222, with respect to the recorded current density J becomes a pre-scribed value. It is preferable to use, for example, about ten days as the predetermined time. It is also preferable, for each temperature change of the cathode 222 from the first chang-ing of the temperature of the cathode 222, to plot the change amount dJ/dT per unit temperature increase of the cathode, and, when the change amount dJ/dT becomes equal to or less than a prescribed value, to estimate the time obtained by adding a predetermined time to the prescribed value, as the lifetime.

As described above, according to the first embodiment, it is possible to highly precisely estimate (predict) the cathode lifetime of the electron gun.

Embodiments have been explained referring to specific examples described above. However, the present invention is not limited to these specific examples.

While the apparatus configuration, control method, and others not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

Further, any method for estimating a cathode lifetime of an electron gun, and electron beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equiva-lents.

What is claimed is:

1. A method for estimating a cathode lifetime of an electron gun comprising:

recording a change amount, per unit temperature increase of a cathode of an electron gun which emits an electron beam, with respect to a parameter value relating to the electron beam which changes with usage time of the cathode, to be recorded in relation to the usage time of the cathode each time a temperature of the cathode is changed; and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by a line approximation function using a plurality of the change amounts recorded each time the temperature of the cathode was changed, a time at which the approximate line indicates that the change amount becomes zero as the lifetime of the cathode, and outputting an estimated lifetime.

2. An electron beam writing apparatus comprising:

a recording circuit configured to perform recording according to claim 1;

an estimation circuit configured to estimate a lifetime according to claim 1;

an output circuit configured to output, at a time of an end of the lifetime estimated is approaching, information indicating that the lifetime is coming to the end soon; and a writing mechanism configured to include an electron gun which emits an electron beam and to write a pattern on a sample by using the electron beam.

3. A method for estimating a cathode lifetime of an electron gun comprising:

recording a change amount, per unit temperature increase of a cathode of an electron gun which emits an electron beam, with respect to a value obtained by differentiat-ing a sample surface current at a position on a sample surface irradiated with the electron beam, by an emis-sion current of the electron beam, to be recorded in relation to a usage time of the cathode each time a temperature of the cathode is changed; and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by a line approximation function using a plurality of the change amounts recorded each time the temperature of the cathode was changed, a time at which the approximate line indicates that the change amount becomes zero as the lifetime of the cathode.

4. An electron beam writing apparatus comprising:

a recording circuit configured to perform recording according to claim 3;

an estimation circuit configured to estimate a lifetime according to claim 3;

an output circuit configured to output, at a time of an end of the lifetime estimated is approaching, information indicating that the lifetime is coming to the end soon; and a writing mechanism configured to include an electron gun which emits an electron beam and to write a pattern on a sample by using the electron beam.

5. A method for estimating a cathode lifetime of an electron gun comprising:

recording a change amount, per unit temperature increase of a cathode of an electron gun which emits an electron beam, with respect to a bias voltage to be applied to a Wehnelt electrode of the electron gun, to be recorded in relation to a usage time of the cathode each time a temperature of the cathode is changed; and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by a line approximation function using a plurality of the change amounts recorded each time the temperature of the cathode was changed, a time at which the approximate line indicates that the change amount becomes zero as the lifetime of the cathode, and outputting an estimated lifetime.

6. An electron beam writing apparatus comprising:

a recording circuit configured to perform recording according to claim 5;

an estimation circuit configured to estimate a lifetime according to claim 5;

an output circuit configured to output, at a time of an end of the lifetime estimated is approaching, information indicating that the lifetime is coming to the end soon; and a writing mechanism configured to include an electron gun which emits an electron beam and to write a pattern on a sample by using the electron beam.

7. A method for estimating a cathode lifetime of an electron gun comprising:

recording a change amount, per unit temperature increase of a cathode of an electron gun which emits an electron beam, with respect to a sample surface current of the electron beam at a position on a sample surface irradiated with the electron beam, to be recorded in relation to a usage time of the cathode each time a temperature of the cathode is changed; and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by a line approximation function using a plurality of the change amounts recorded each time the temperature of the cathode was changed, a time at which the approximate line indicates that the change amount becomes zero as the lifetime of the cathode, and outputting an estimated lifetime.

8. An electron beam writing apparatus comprising:

a recording circuit configured to perform recording according to claim 7;

an estimation circuit configured to estimate a lifetime according to claim 7;

an output circuit configured to output, at a time of an end of the lifetime estimated is approaching, information indicating that the lifetime is coming to the end soon; and a writing mechanism configured to include an electron gun which emits an electron beam and to write a pattern on a sample by using the electron beam.

9. A method for estimating a cathode lifetime of an electron gun comprising:

recording a change amount, per unit temperature increase of a cathode of an electron gun which emits an electron beam, with respect to a current density of the electron beam at a position on a sample surface irradiated with the electron beam, to be recorded in relation to a usage time of the cathode each time a temperature of the cathode is changed; and estimating a lifetime of the cathode by one of estimating a time obtained by adding a predetermined time to a time at which the change amount recorded a plurality of times becomes lower than a prescribed value as the lifetime of the cathode, and estimating, using an approximate line obtained by a line approximation function using a plurality of the change amounts recorded each time the temperature of the cathode was changed, a time at which the approximate line indicates that the change amount becomes zero as the lifetime of the cathode, and outputting an estimated lifetime.

10. An electron beam writing apparatus comprising:

a recording circuit configured to perform recording according to claim 9;

an estimation circuit configured to estimate a lifetime according to claim 9;

an output circuit configured to output, at a time of an end of the lifetime estimated is approaching, information indicating that the lifetime is coming to the end soon; and a writing mechanism configured to include an electron gun which emits an electron beam and to write a pattern on a sample by using the electron beam.

* * * * *